(12) United States Patent
Yang et al.

(10) Patent No.: US 11,563,010 B2
(45) Date of Patent: Jan. 24, 2023

(54) INTEGRATED ASSEMBLIES, AND METHODS OF FORMING INTEGRATED ASSEMBLIES

(71) Applicant: Micron Technology, Inc., Boise, ID (US)

(72) Inventors: Litao Yang, Boise, ID (US); Srinivas Pulugurtha, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 605 days.

(21) Appl. No.: 16/666,709

(22) Filed: Oct. 29, 2019

(65) Prior Publication Data
US 2021/0125997 A1    Apr. 29, 2021

(51) Int. Cl.
*H01L 27/108*    (2006.01)
*H01L 27/06*    (2006.01)
(Continued)

(52) U.S. Cl.
CPC .... *H01L 27/10838* (2013.01); *H01L 21/8254* (2013.01); *H01L 27/0605* (2013.01);
(Continued)

(58) Field of Classification Search
CPC ......... H01L 27/10808; H01L 27/10814; H01L 27/10852; H01L 27/10855;
(Continued)

(56) References Cited

U.S. PATENT DOCUMENTS 8,288,289 B2    10/2012    Jeong et al.
9,449,978 B2    9/2016    Karda et al.
(Continued)

FOREIGN PATENT DOCUMENTS

JP    2006-108406    4/2006
KR    10-2006-0059543    6/2006
(Continued)

OTHER PUBLICATIONS

WO PCT/US2020/056175 Search Rept., dated Feb. 3, 2021, Micron Technology, Inc.
(Continued)

*Primary Examiner* — Marcos D. Pizarro
(74) *Attorney, Agent, or Firm* — Wells St. John P.S.

(57) ABSTRACT

Some embodiments include an integrated assembly having an active region which contains semiconductor material. The active region includes first, second and third source/drain regions within the semiconductor material, includes a first channel region within the semiconductor material and between the first and second source/drain regions, and includes a second channel region within the semiconductor material and between the second and third source/drain regions. The semiconductor material includes at least one element selected from Group 13 of the periodic table. A digit line is electrically coupled with the second source/drain region. A first transistor gate is operatively proximate the first channel region. A second transistor gate is operatively proximate the second channel region. A first storage-element is electrically coupled with the first source/drain region. A second storage-element is electrically coupled with the third source/drain region. Some embodiments include methods of forming integrated assemblies.

24 Claims, 31 Drawing Sheets

(51) Int. Cl.
    *H01L 21/8254* (2006.01)
    *H01L 29/10* (2006.01)

(52) U.S. Cl.
    CPC .... *H01L 27/0629* (2013.01); *H01L 27/10814* (2013.01); *H01L 27/10855* (2013.01); *H01L 27/10882* (2013.01); *H01L 27/10888* (2013.01); *H01L 29/1037* (2013.01)

(58) Field of Classification Search
    CPC ......... H01L 27/10873; H01L 27/10882; H01L 27/10885; H01L 27/10888; H01L 27/10891; H01L 21/8252; H01L 21/8254; H01L 29/1037
    See application file for complete search history.

(56) References Cited

U.S. PATENT DOCUMENTS

| | | |
|---|---|---|
| 10,510,957 B2 | 12/2019 | Pirovano et al. |
| 10,916,295 B2 | 2/2021 | Derner et al. |
| 2006/0006444 A1 | 1/2006 | Leslie |
| 2008/0017905 A1 | 1/2008 | Eppich |
| 2009/0294833 A1 | 12/2009 | Kim |
| 2019/0206870 A1 | 7/2019 | Gao et al. |
| 2020/0066730 A1* | 2/2020 | Guo .................. H01L 27/10885 |
| 2020/0111918 A1 | 4/2020 | Karda et al. |
| 2020/0279953 A1* | 9/2020 | Sharma ............. H01L 27/10897 |

FOREIGN PATENT DOCUMENTS

| | | | |
|---|---|---|---|
| KR | 2006059543 A * | 6/2006 | ....... H01L 27/10814 |
| TW | 201140652 | 11/2011 | |
| TW | 201539715 | 10/2015 | |
| TW | 201911537 | 3/2019 | |
| TW | 202010098 | 3/2020 | |
| TW | 202029467 | 8/2020 | |
| TW | 109137377 | 5/2021 | |
| WO | PCT/US2020/056175 | 5/2022 | |

OTHER PUBLICATIONS

WO PCT/US2020/056175 Writ. Opin., dated Feb. 3, 2021, Micron Technology, Inc.

* cited by examiner

INTEGRATED ASSEMBLIES, AND METHODS OF FORMING INTEGRATED ASSEMBLIES

TECHNICAL FIELD

Integrated assemblies (e.g., integrated memory), and methods of forming integrated assemblies.

BACKGROUND

Semiconductor materials may be incorporated into integrated assemblies. For instance, the semiconductor materials may be utilized as active regions which comprise channel regions and source/drain regions of transistors. The transistors may be utilized as access devices in memory arrays, or in other applications.

It would be desirable to develop improved active region arrangements suitable for utilization in integrated assemblies, and to develop integrated components utilizing the improved arrangements. It would also be desirable to develop improved memory-cell configurations, and improved memory-array configurations.

BRIEF DESCRIPTION OF THE DRAWINGS

FIG. 11C is at a different scale than FIG. 11.

DETAILED DESCRIPTION OF THE ILLUSTRATED EMBODIMENTS

Some embodiments include memory architectures having memory active regions supported over digit lines (i.e., sense lines, bitlines, etc.), and having wordlines (i.e., access lines, etc.) extending across the digit lines and the active regions. The memory active regions may be incorporated into memory cells, and each of the memory cells may be uniquely addressed utilizing one of the digit lines and one of the wordlines. Some embodiments include memory architectures in which memory active regions comprise semiconductor material which includes at least one element selected from Group 13 of the periodic table (e.g., gallium (Ga), indium (In), thallium (Tl), etc.). The memory active regions may be over digit lines. The digit lines may extend horizontally, and the memory active regions may also extend horizontally. Example embodiments are described with reference to FIGS. 1-15.

FIGS. 1-12 illustrate an example method of forming an example memory array.

Figure 1:
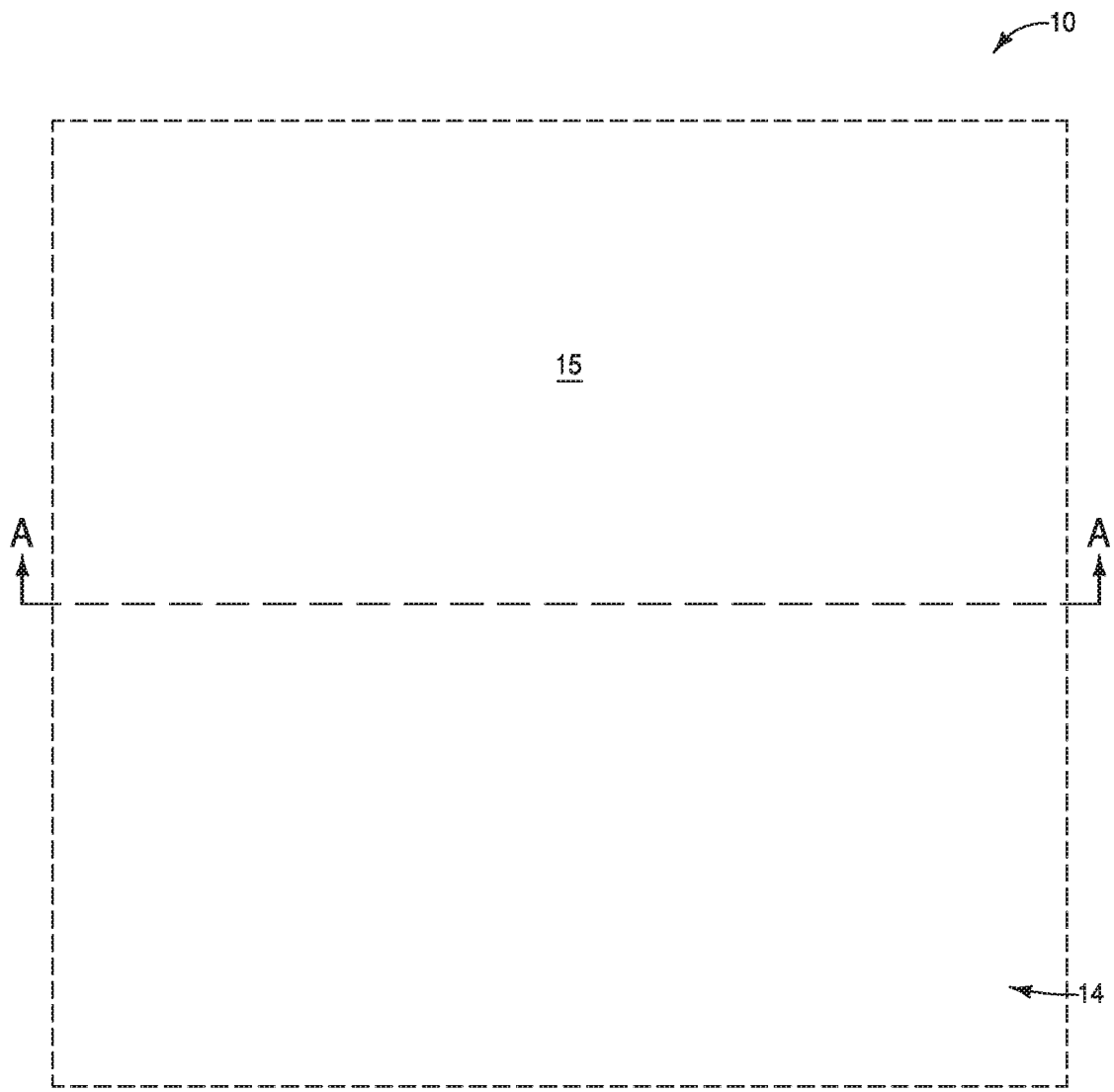
FIGS. 1 and 1A are a diagrammatic top-down view and a diagrammatic cross-sectional side view, respectively, of a region of an example integrated assembly at an example process stage of an example method for forming an example memory array. The cross-sectional view of FIG. 1A is along the line A-A of FIG. 1.
Figure 1A:
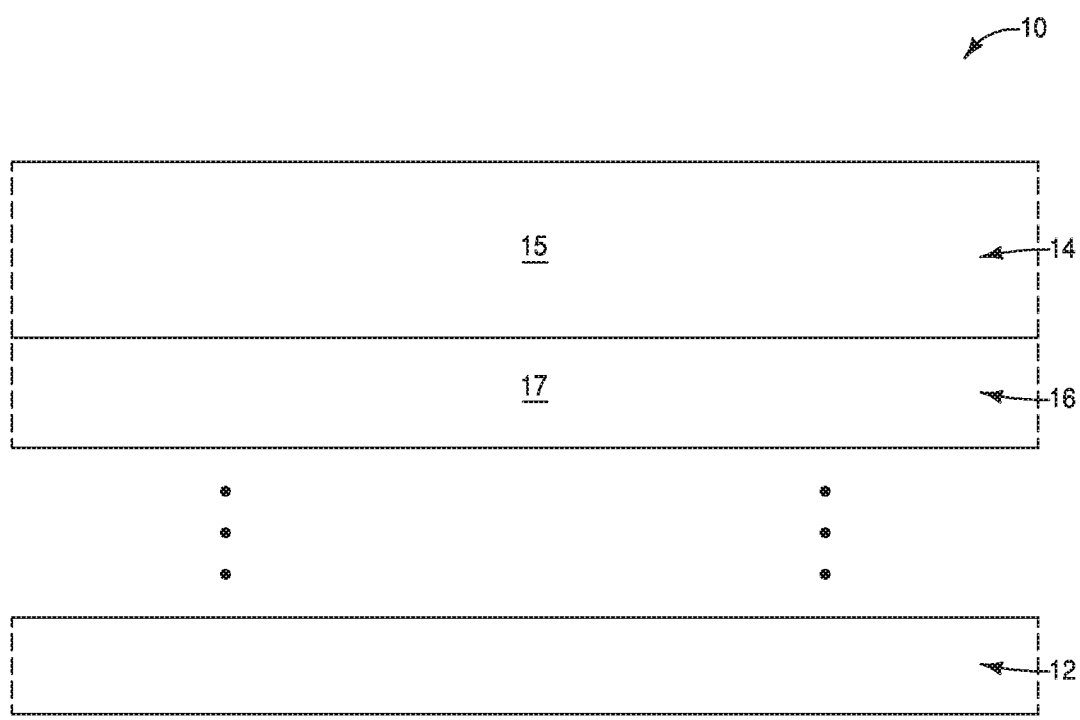

Referring to FIGS. 1 and 1A, an integrated assembly 10 includes a mass 14 over a supporting insulative structure 16.

The mass 14 comprises material (mass material) 15. Such material may comprise any suitable composition(s); and in some embodiments may comprise one or more of silicon dioxide, low-k dielectric material, etc. The term "low-k" means a dielectric constant less than that typically associated with silicon dioxide (i.e., less than about 3.9). Example low-k materials are porous silicon dioxide, carbon-doped silicon dioxide, boron-doped silicon dioxide, etc.

The insulative structure 16 comprises an insulative material 17. Such insulative material may comprise any suitable composition(s); and in some embodiments may comprise, consist essentially of, or consist of one or more of silicon nitride, silicon dioxide, low-k dielectric material, high-k dielectric material, etc.

The insulative structure 16 is supported by an underlying base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the insulative material 16 to indicate that other materials, components, etc., may be provided between the base 12 and the insulative material 16. In some embodiments, the insulative material 16 may be provided directly against an upper surface of the base 12.

Figure 2:
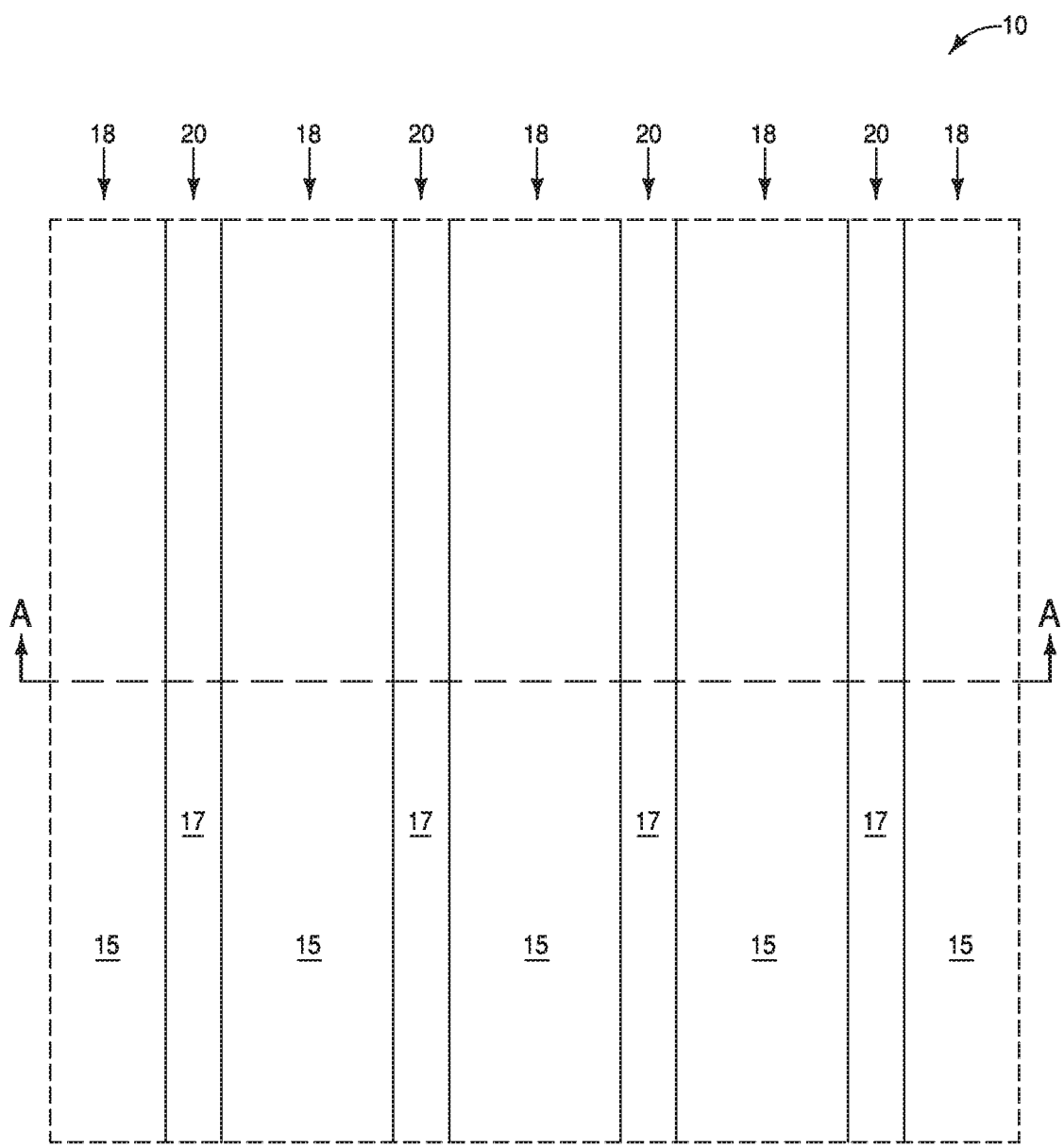
FIGS. 2 and 2A are a diagrammatic top-down view and a diagrammatic cross-sectional side view, respectively, of the region of the example integrated assembly of FIGS. 1 and 1A at an example process stage following the process stage of FIGS. 1 and 1A. The cross-sectional view of FIG. 2A is along the line A-A of FIG. 2.
Figure 2A:
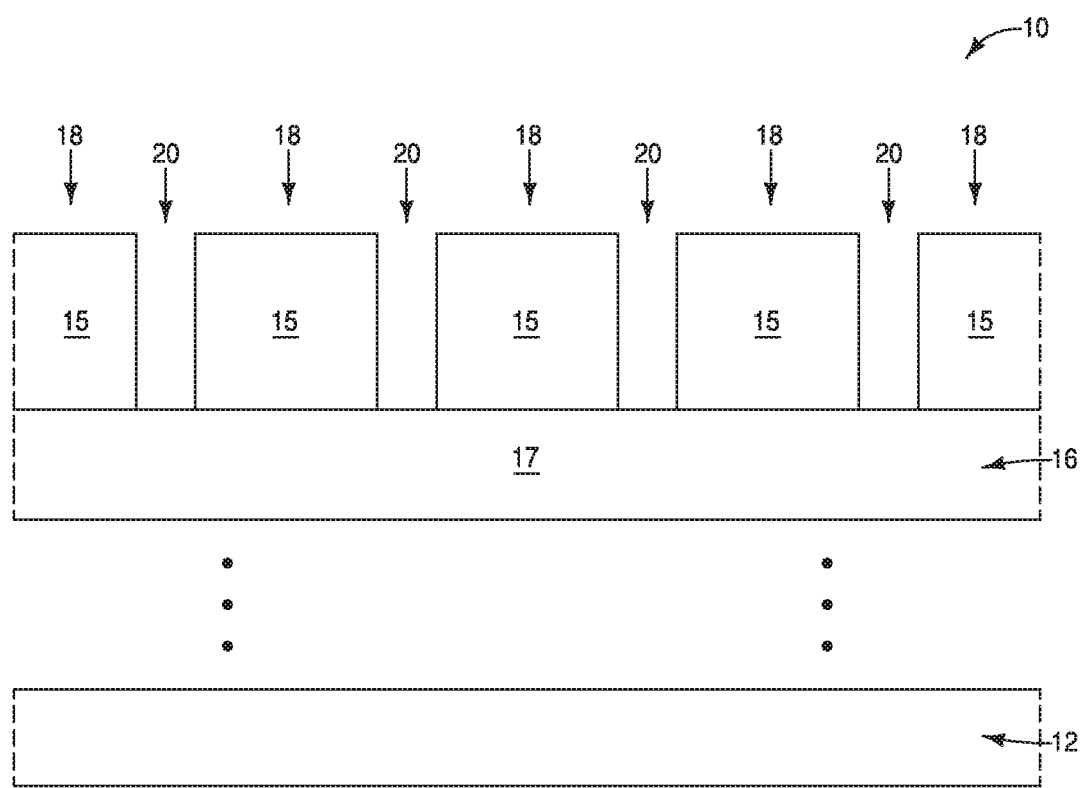

Referring to FIGS. 2 and 2A, the mass 14 (FIGS. 1 and 1A) is patterned into a plurality of linear features 18, with such linear features being spaced from one another by intervening gaps 20. The linear features extend along a first direction which is indicated to be a y-axis direction relative to the top-down view of FIG. 2.

Figure 3:
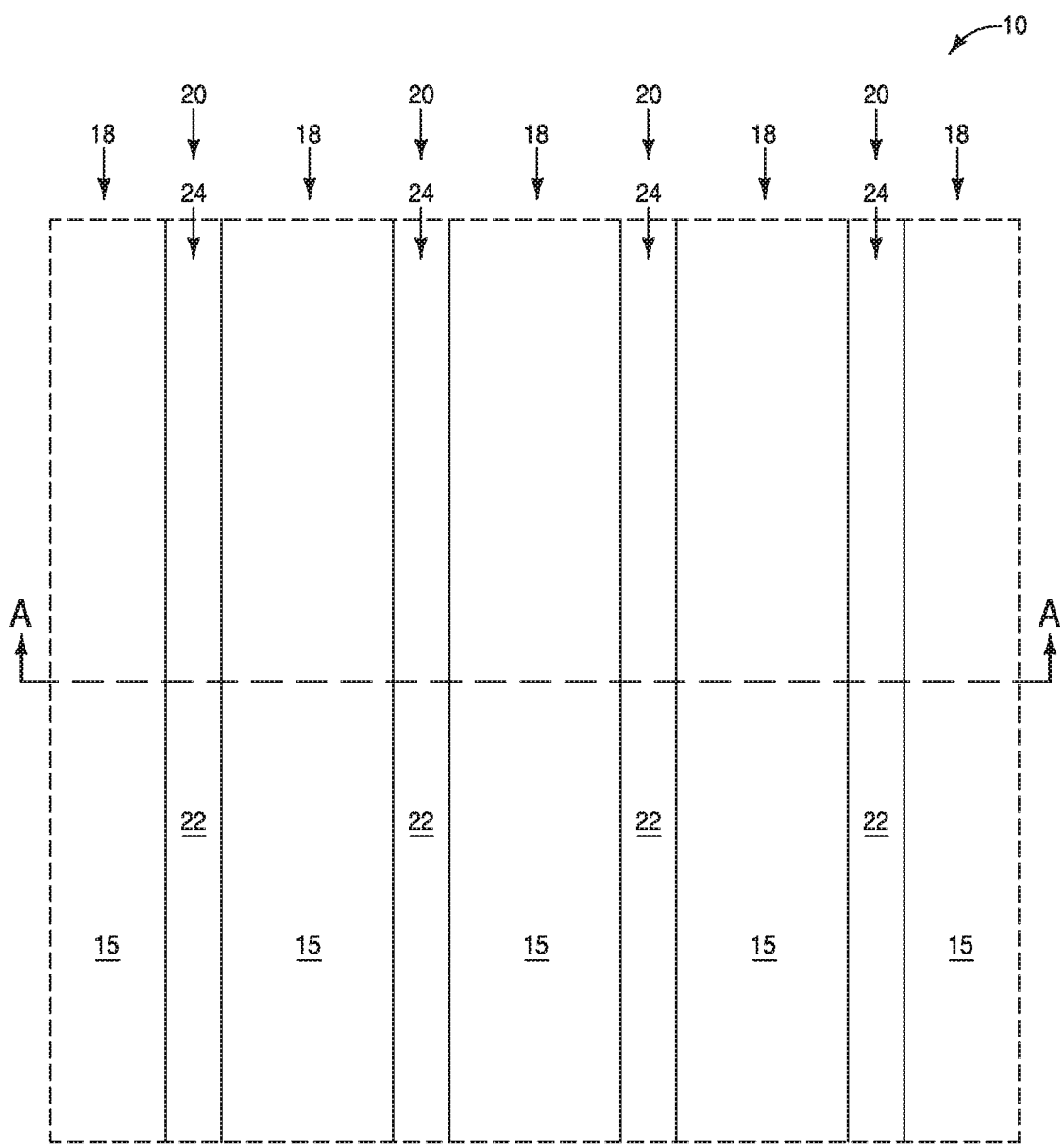
FIGS. 3 and 3A are a diagrammatic top-down view and a diagrammatic cross-sectional side view, respectively, of the region of the example integrated assembly of FIGS. 1 and 1A at an example process stage following the process stage of FIGS. 2 and 2A. The cross-sectional view of FIG. 3A is along the line A-A of FIG. 3.
Figure 3:
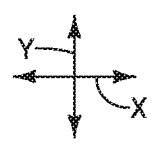
Figure 3A:
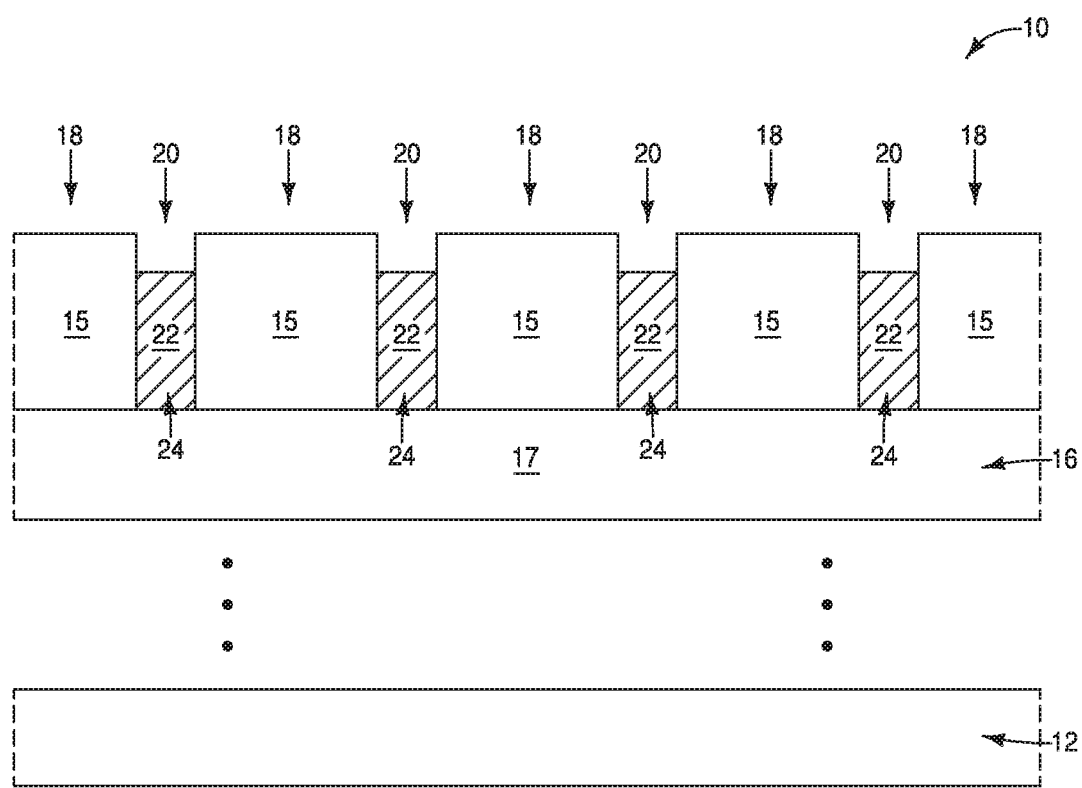

Referring to FIGS. 3 and 3A, conductive digit line material 22 is provided within the gaps 20. The digit line material within the gaps is patterned into digit lines 24. Such digit lines extend along the first direction (y-axis direction) defined by the gaps 20. In some embodiments the digit line material 22 may be formed over the material 15, and may then be removed from over the material 15 utilizing planarization (e.g., chemical-mechanical processing) or other suitable processing. The process of forming trenches, followed by forming of material within the trenches to a level which overfills the trenches, and then removing excess material with planarization or other suitable processing, may be referred to as damascene processing.

The digit lines 24 may be recessed within the gaps 20 utilizing any suitable processing; including, for example, etch chemistry which is selective for the conductive material 22 relative to the material 15.

The digit lines 24 are spaced apart from one another, and specifically are spaced from one another along the x-axis direction of FIG. 3.

The digit line material 22 comprise may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit line material 22 may be a metal-containing material. Such metal-containing material may comprise any suitable composition(s); such as, for example, one or more of titanium, tungsten, titanium nitride, tungsten nitride, tantalum nitride, etc.

Figure 4:
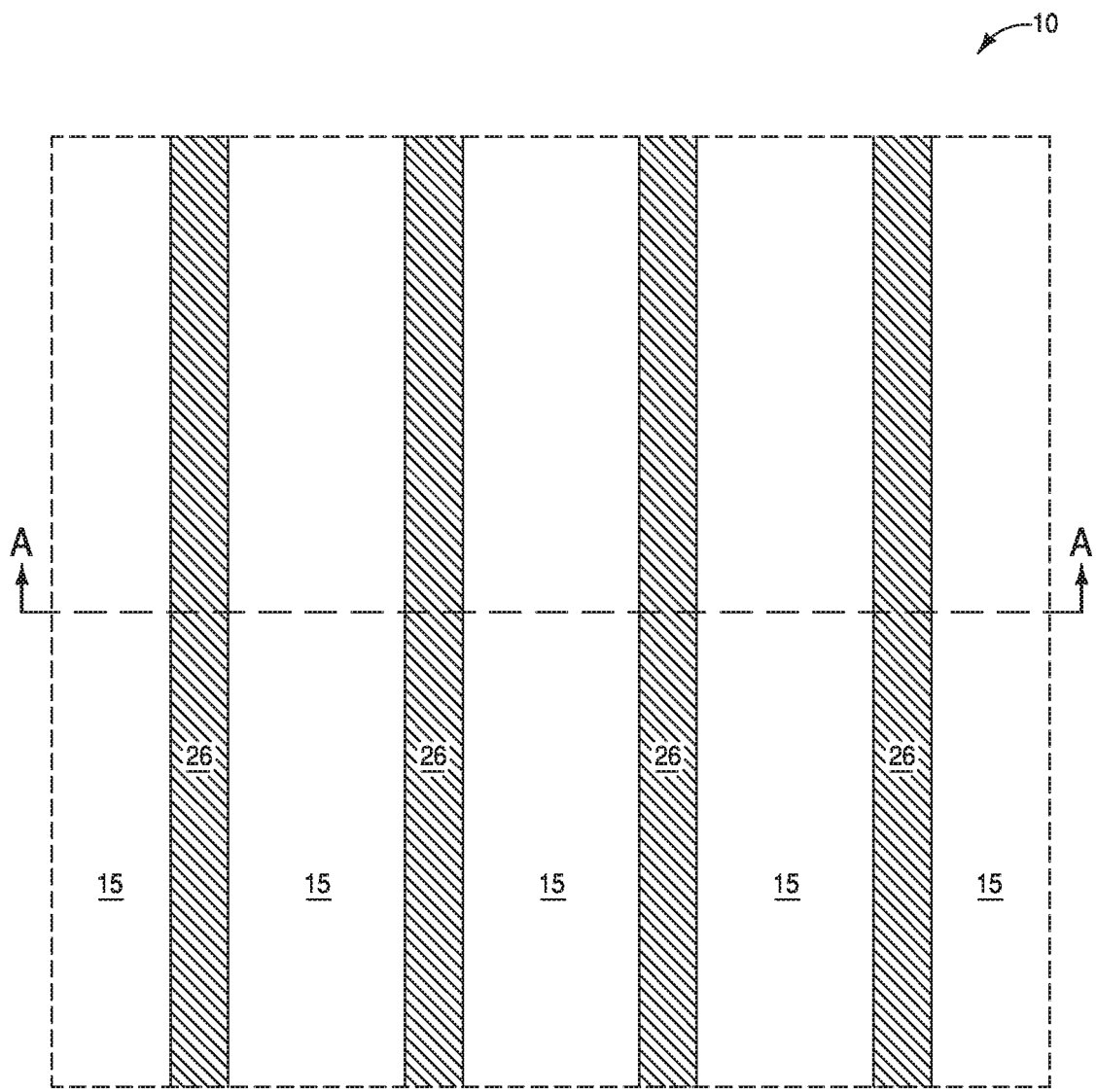
FIGS. 4 and 4A are a diagrammatic top-down view and a diagrammatic cross-sectional side view, respectively, of the region of the example integrated assembly of FIGS. 1 and 1A at an example process stage following the process stage of FIGS. 3 and 3A. The cross-sectional view of FIG. 4A is along the line A-A of FIG. 4.
Figure 4A:
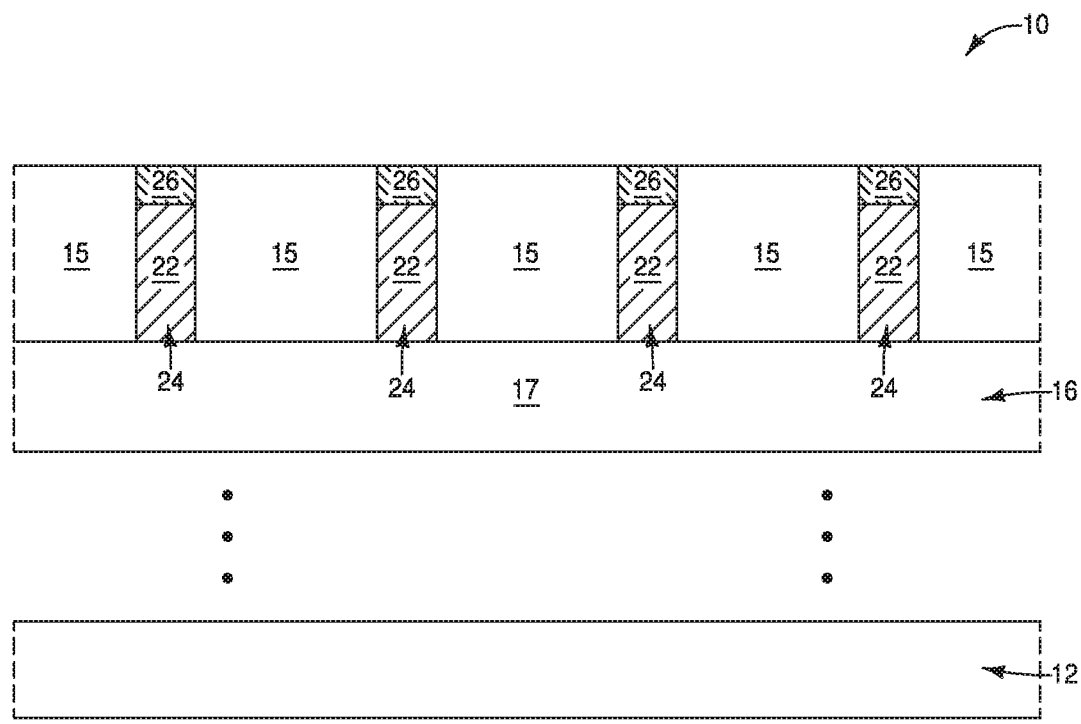

Referring to FIGS. 4 and 4A, conductive interconnect material 26 is formed within the gaps 20 (FIGS. 3 and 3A), and over the digit lines 24. The conductive interconnect material 26 may be formed within the gaps 20 utilizing damascene processing.

The conductive interconnect material 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive interconnect material 26 may be a metal-containing material. Such metal-containing material may comprise any suitable composition(s); such as, for example, one or more of titanium, tungsten, titanium nitride, tungsten nitride, tantalum nitride, etc.

The conductive interconnect material 26 may comprise a same composition as the digit line material 22, or may comprise a different composition relative to the digit line material. In some embodiments, the conductive interconnect material 26 and the digit line material 22 may both be metal-containing materials, but may be different compositions relative to one another. For instance, the conductive interconnect material 26 may comprise a metal nitride (e.g., titanium nitride, tantalum nitride, tungsten nitride, etc.), and the digit line material 22 may comprise, consist essentially of, or consist of tungsten. In some embodiments, the digit line material 22 may be referred to as a first conductive material, and the interconnect material 26 may be referred to as a second conductive material.

Figure 5:
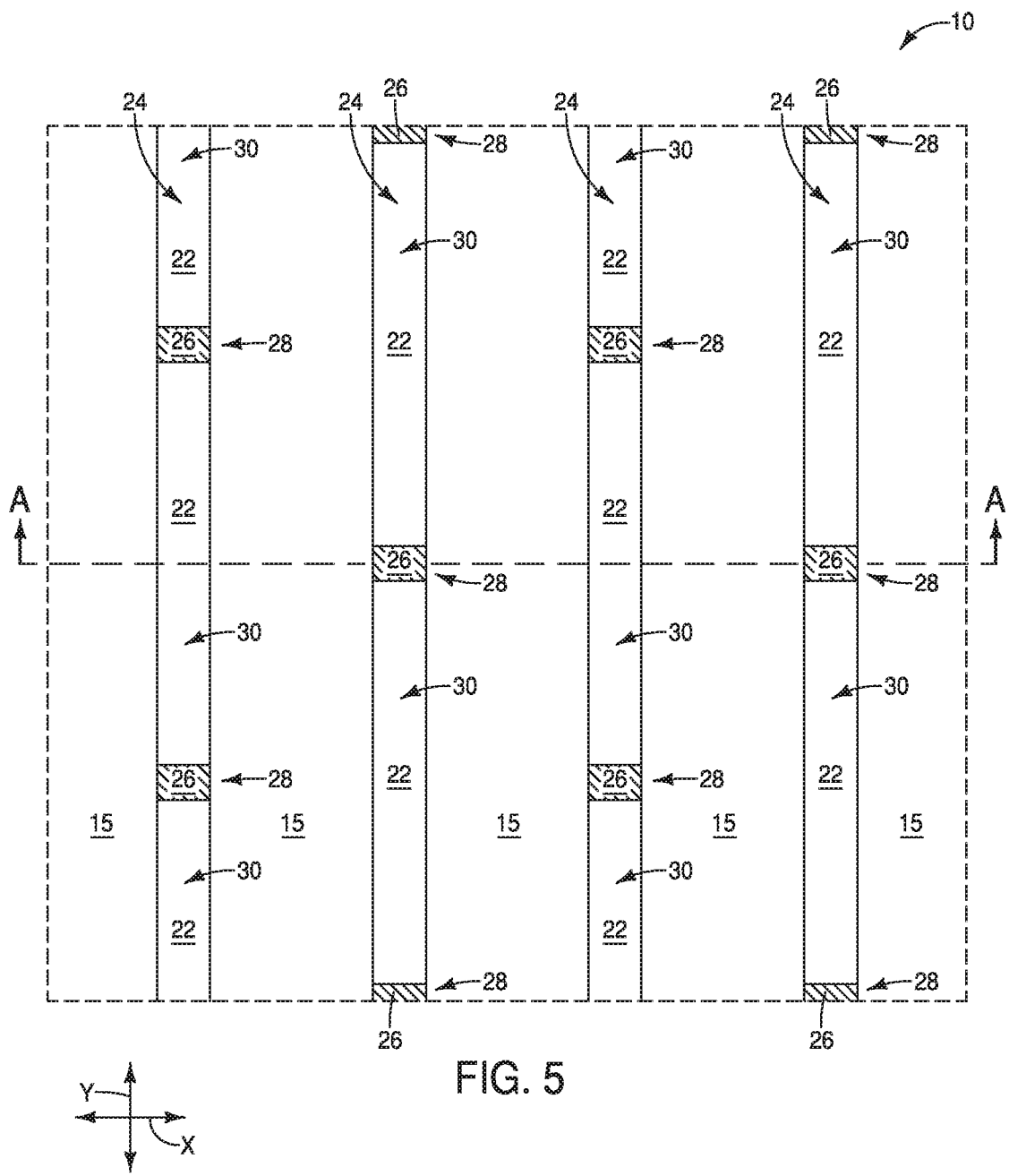
FIGS. 5 and 5A are a diagrammatic top-down view and a diagrammatic cross-sectional side view, respectively, of the region of the example integrated assembly of FIGS. 1 and 1A at an example process stage following the process stage of FIGS. 4 and 4A. The cross-sectional view of FIG. 5A is along the line A-A of FIG. 5.
Figure 5A:
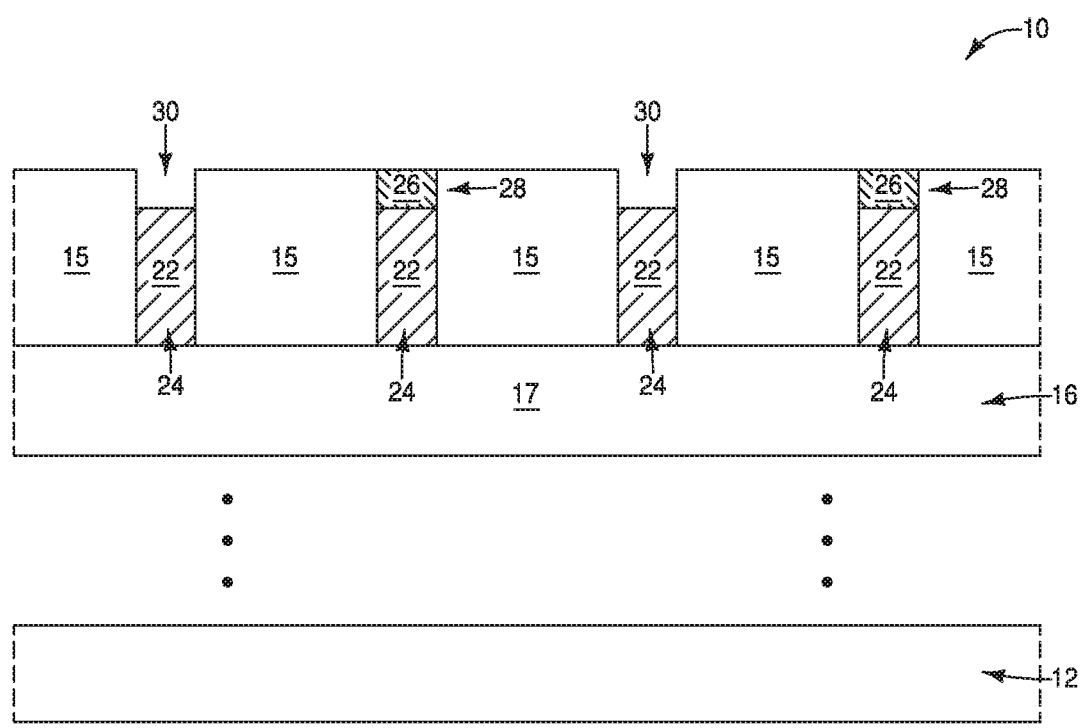

Referring to FIGS. 5 and 5A, regions of the conductive interconnect material 26 are removed to pattern remaining portions of the conductive interconnect material 26 into conductive contacts (interconnects) 28. The conductive interconnect material 26 may be patterned with any suitable processing. For instance, a patterned mask (e.g., a photolithographically-patterned photoresist mask) may be utilized to protect the material 26 within the locations of the conductive contacts 28, and then unprotected segments of the material 26 may be removed with an etch selective for the material 26 relative to the underlying digit line material 22. Subsequently, the protective mask may be removed to leave the configuration shown in FIGS. 5 and 5A. In some embodiments, it may be advantageous for the conductive interconnect material 26 to comprise a different composition than the digit line material 22 so that the conductive interconnect material 26 may be selectively removed relative to the digit line material 22.

The contacts 28 are spaced apart from one another, and are electrically coupled with the digit lines 24. In the illustrated embodiment, the contacts 28 are directly against the digit lines 24. In some embodiments, the digit lines 24 may be considered to extend substantially horizontally, and the contacts 28 may be considered to extend substantially vertically (i.e., upwardly) from the digit lines. The term "substantially horizontally" means horizontally to within reasonable tolerances of fabrication and measurement, and the term "substantially vertically" means vertically to within reasonable tolerances of fabrication and measurement. In some embodiments, the base 12 may have a planar, horizontal upper surface (as shown), the term "substantially horizontal" may mean to within 10° of being parallel to the planar upper surface, and the term "substantially vertical" may mean to within 10° of being orthogonal to the planar upper surface.

The removal of the segments of the conductive material 26 from over the digit lines 24 leaves gaps 30 over regions of the digit lines.

Figure 6:
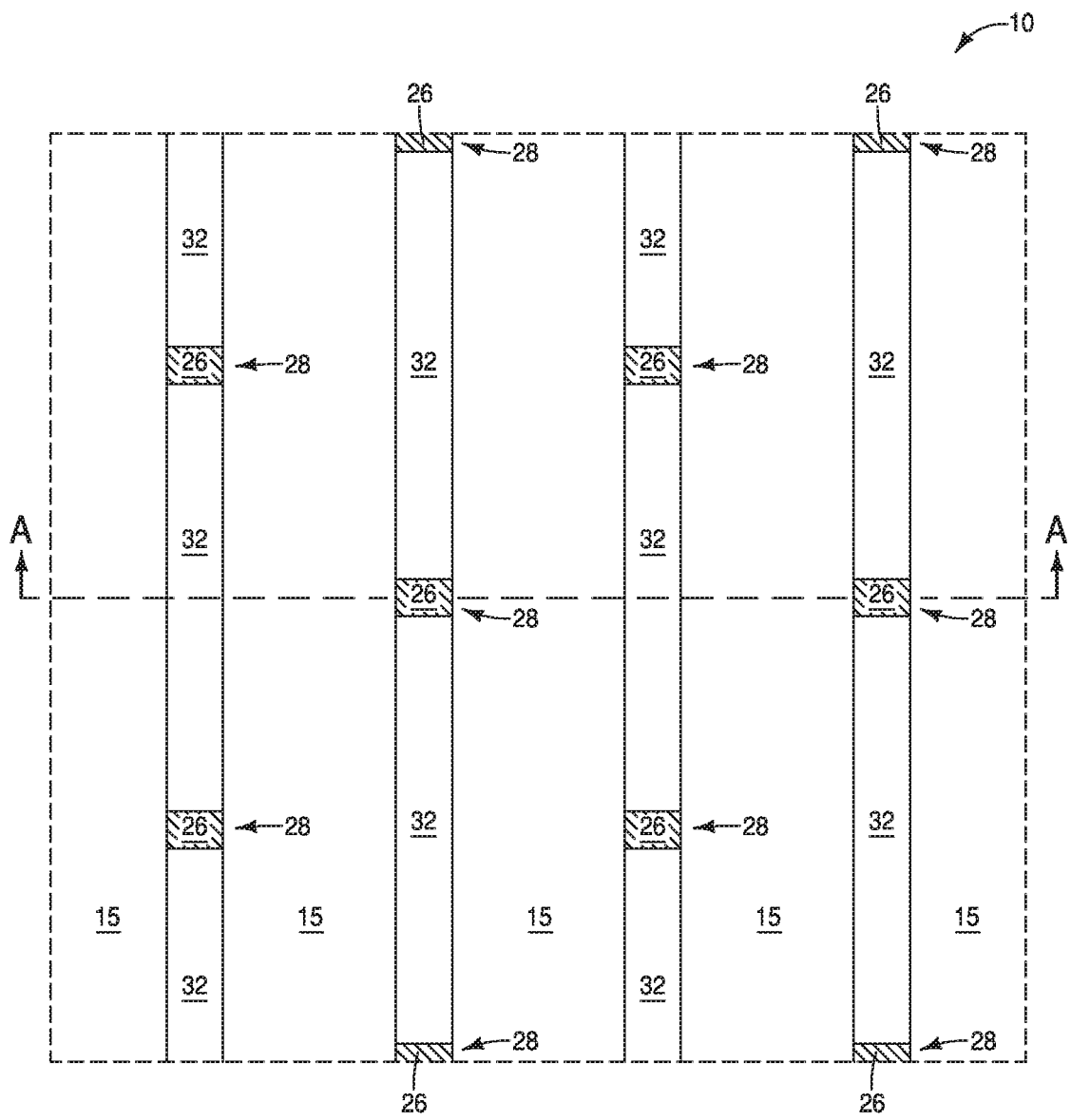
FIGS. 6 and 6A are a diagrammatic top-down view and a diagrammatic cross-sectional side view, respectively, of the region of the example integrated assembly of FIGS. 1 and 1A at an example process stage following the process stage of FIGS. 5 and 5A. The cross-sectional view of FIG. 6A is along the line A-A of FIG. 6.
Figure 6A:
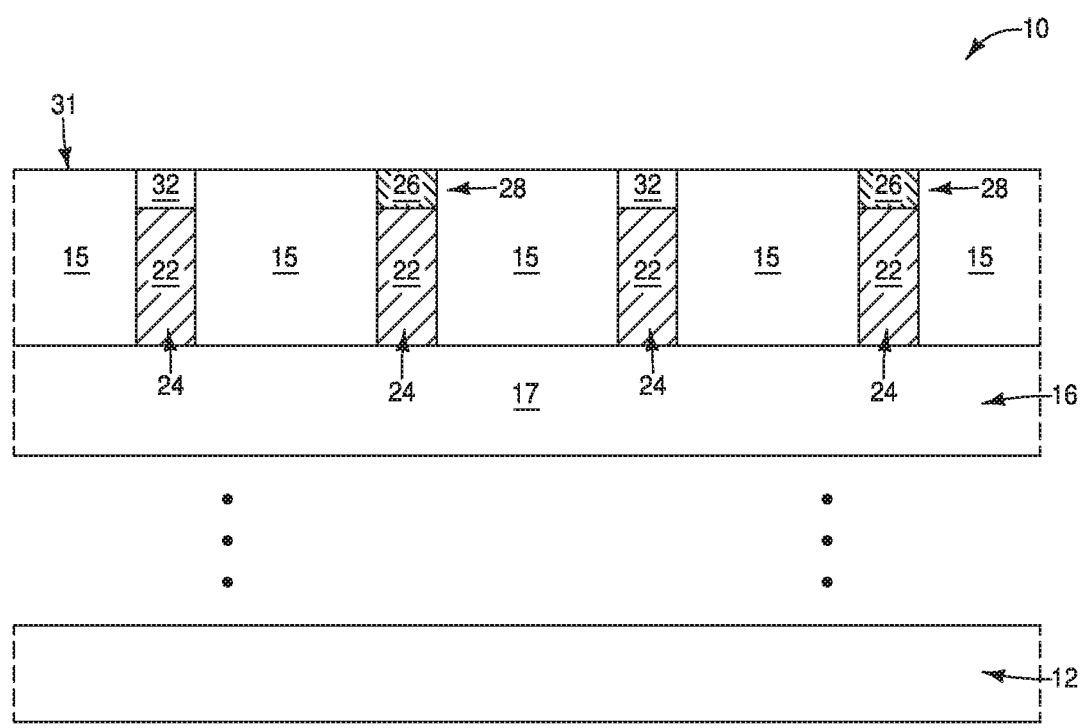

Referring to FIGS. 6 and 6A, an insulative material 32 is formed within the gaps 30 (FIGS. 5 and 5A). The insulative material 32 may comprise any suitable composition(s); and in some embodiments may comprise, consist essentially of, or consist of silicon dioxide.

The insulative material 32 may be initially formed to extend across the material 15, as well as within the gaps 30; and may then be removed from over the material 15 with a planarization process (e.g., chemical mechanical polishing). The planarization process forms a planarized surface 31 extending across the materials 15, 26 and 32.

Figure 7:
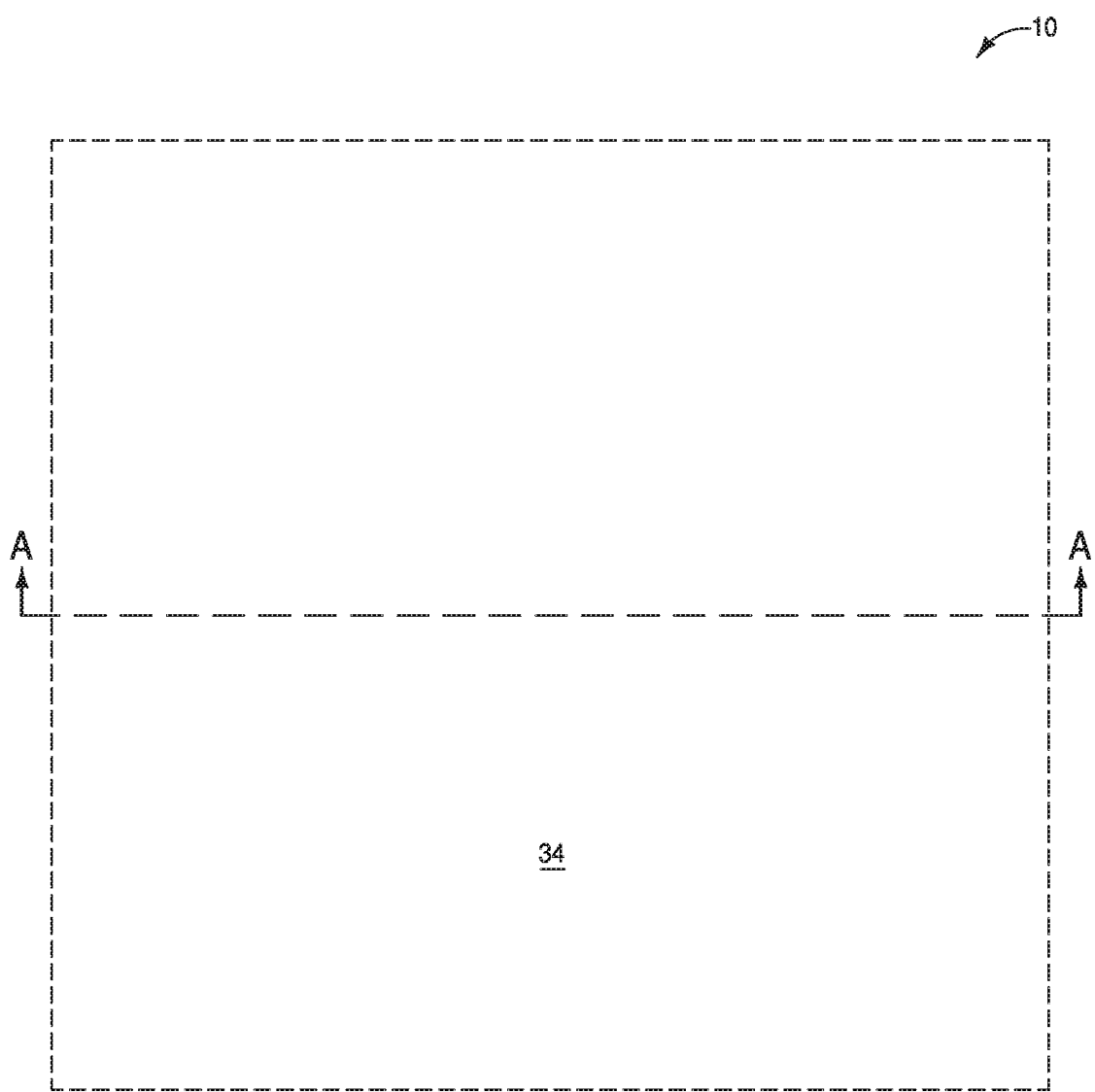
FIGS. 7 and 7A are a diagrammatic top-down view and a diagrammatic cross-sectional side view, respectively, of the region of the example integrated assembly of FIGS. 1 and 1A at an example process stage following the process stage of FIGS. 6 and 6A. The cross-sectional view of FIG. 7A is along the line A-A of FIG. 7.
Figure 7:
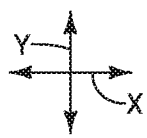
Figure 7A:
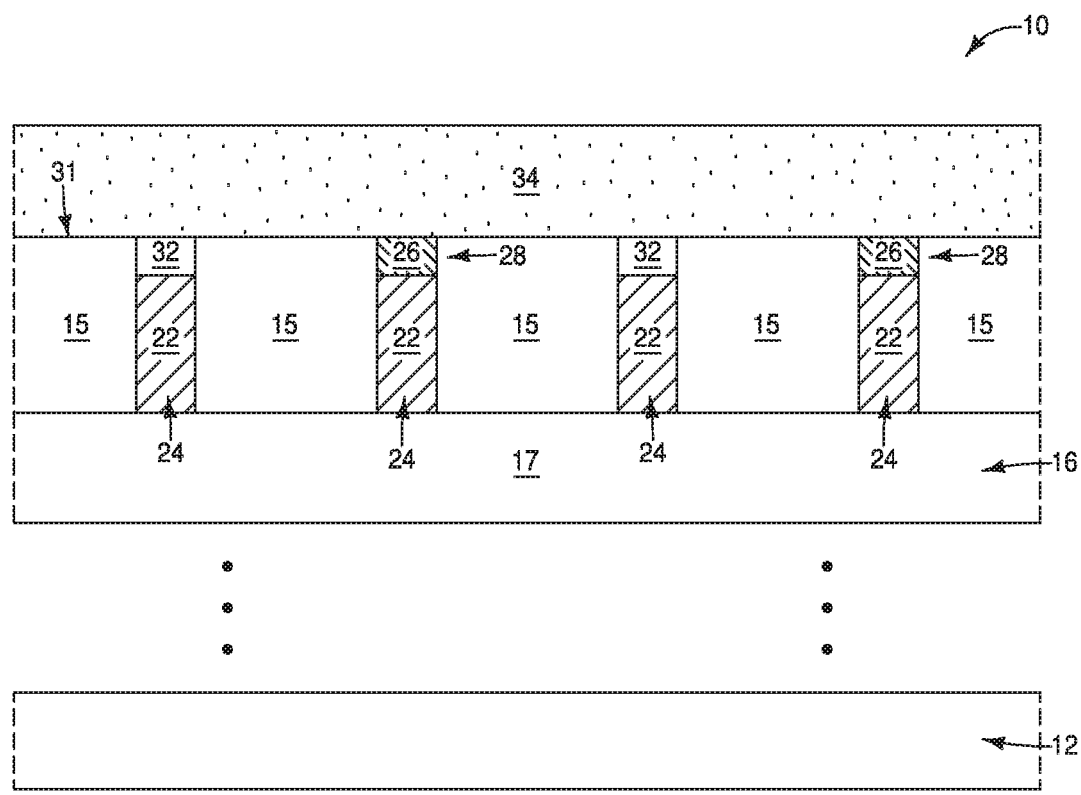

Referring to FIGS. 7 and 7A, a semiconductor material 34 is formed on the planarized surface 31, and specifically is formed over the spaced-apart contacts 28.

The semiconductor material 34 may comprise any suitable composition(s); and in some embodiments may comprise, consist essentially of, or consist of material comprising at least one element selected from Group 13 of the periodic table (e.g., one or more of aluminum (Al), gallium (Ga), indium (In) and thallium (Tl)). The semiconductor material 34 may further include at least one element selected from Group 15 of the periodic table (e.g., one or more of phosphorus (P), arsenic (As) and antimony (Sb)). For instance, the semiconductor material may comprise one or more of GaP, AlAs, GaAs, AlP, InP, AlSb, GaAlAs, GaInAs and GaInP; where the chemical formulas indicate primary constituents rather than specific stoichiometries.

In some embodiments, the semiconductor material 34 may comprise at least one element selected from Group 13 of the periodic table, and at least one element selected from Group 16 of the periodic table (e.g., one or more of oxygen (O), sulfur (S), selenium (Se) and tellurium (Te)). In some embodiments, the semiconductor material 34 may comprise one or more elements selected from Group 14 of the periodic table (e.g., one or more of silicon, germanium, etc.).

In some embodiments, the semiconductor material 34 may comprise a metal selected from the group consisting of aluminum, gallium, indium, thallium, tin, cadmium, zinc and mixtures thereof, in combination with one or more of oxygen, sulfur, selenium and tellurium.

Figure 8:
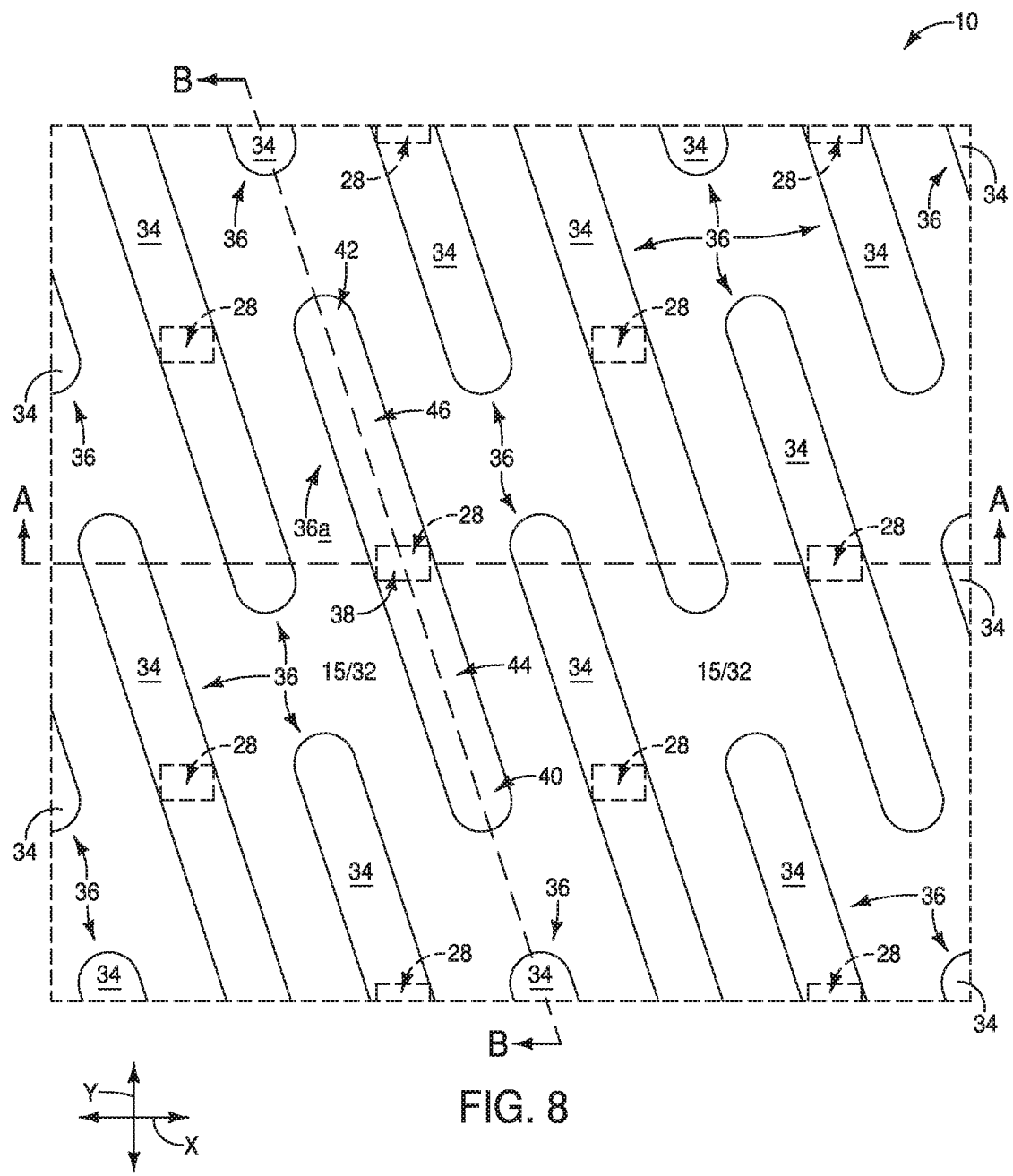
FIGS. 8, 8A and 8B are a diagrammatic top-down view (FIG. 8) and diagrammatic cross-sectional side views (FIGS. 8A and 8B) of the region of the example integrated assembly of FIGS. 1 and 1A at an example process stage following the process stage of FIGS. 7 and 7A. The cross-sectional views of FIGS. 8A and 8B are along the lines A-A and B-B of FIG. 8, respectively.
Figure 8A:
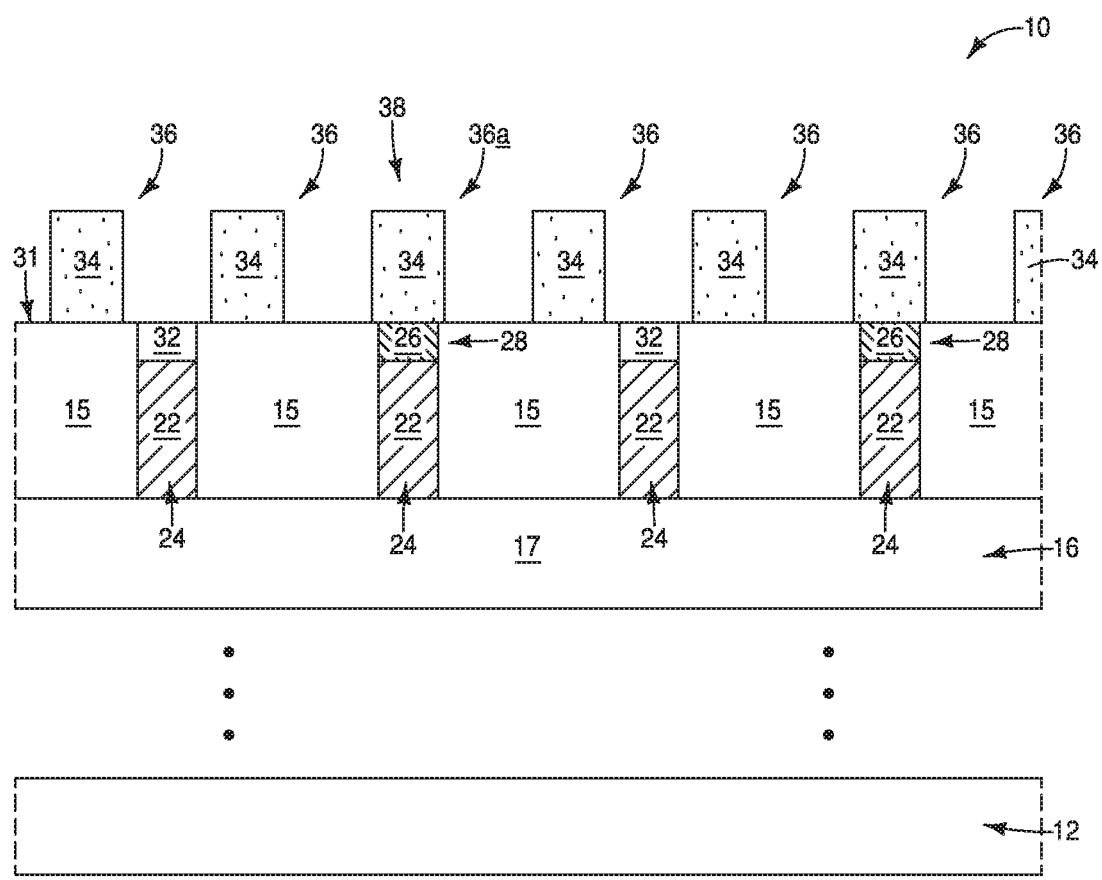
Figure 8B:
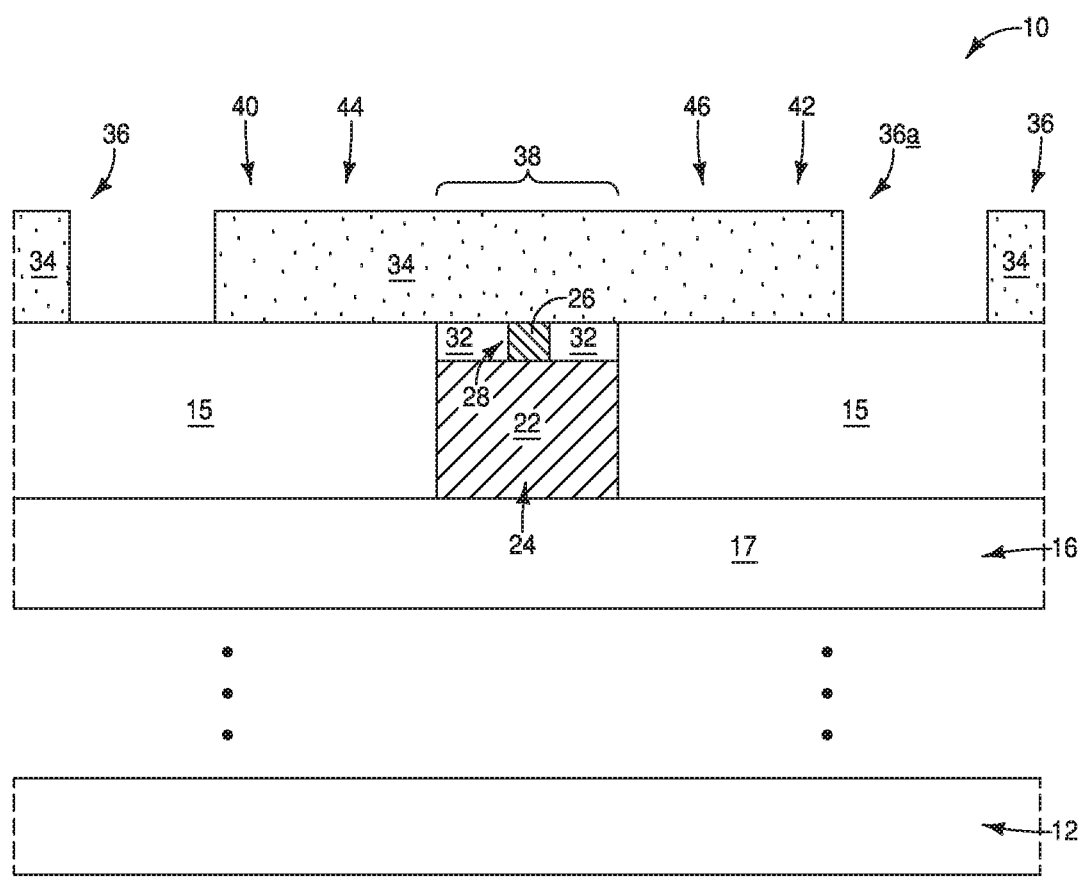

Referring to FIGS. 8, 8A and 8B, the semiconductor material 34 is patterned into active regions 36. Such active regions may be considered to extend horizontally (or at least substantially horizontally) along the planarized upper surface 31. The contacts 28 are shown in dashed-line view in FIG. 8 to indicate that such contacts are under the active regions 36. The insulative material beneath the active regions 36 is generically indicated to be "15/32" to indicate that such insulative material comprises both the material 15 and the material 32. The insulative material 32 is not specifically diagrammed in FIG. 8 so that the emphasis of such figure is on the active regions 36 and the general layout of such active regions.

One of the active regions 36 is designated as 36a so that it may be distinguished from the other active regions in the description which follows. All of the active regions are substantially identical to one another, with the term "substantially identical" meaning identical to within reasonable tolerances of fabrication and measurement.

Figure 10:
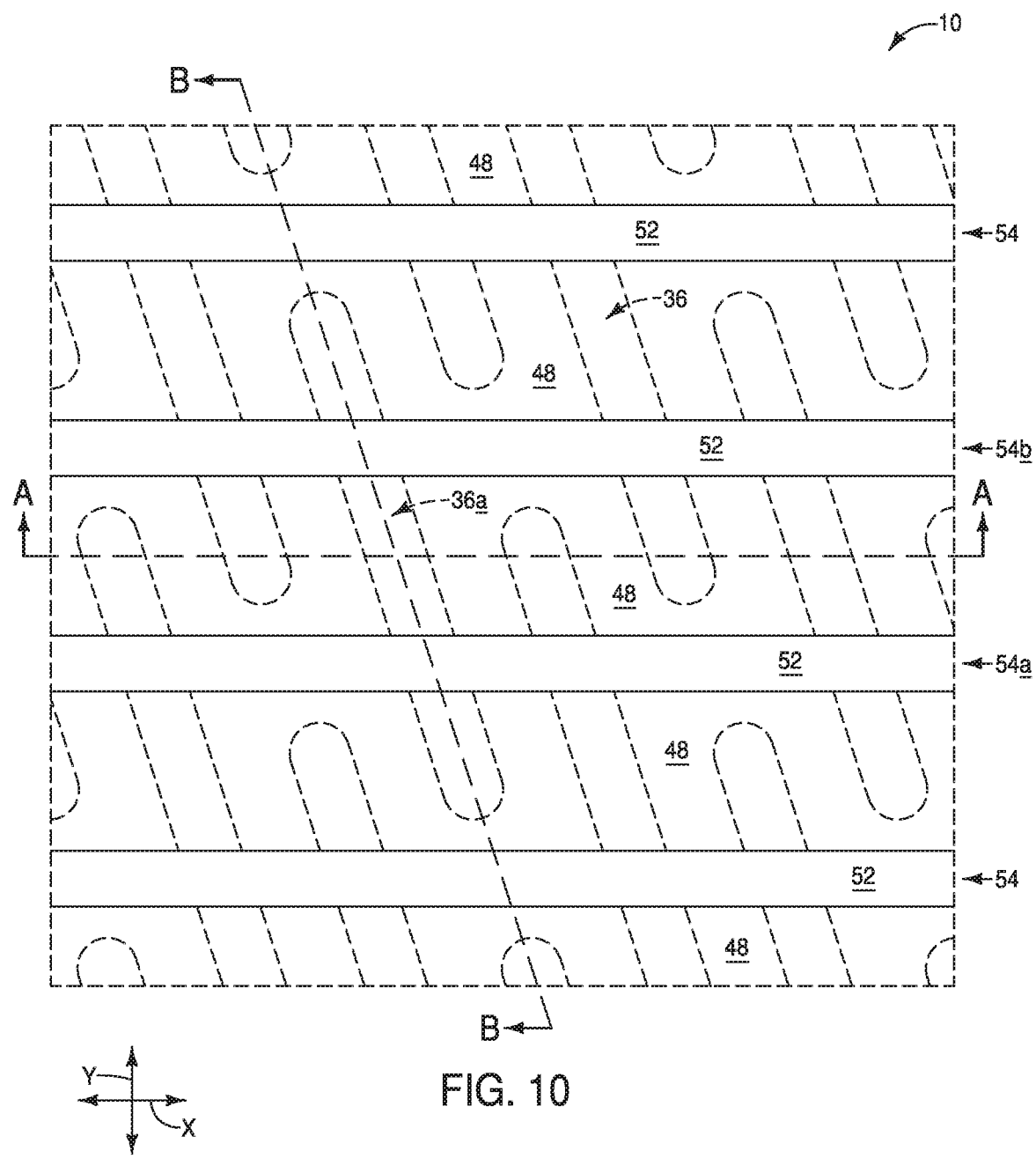
FIGS. 10, 10A and 10B are a diagrammatic top-down view (FIG. 10) and diagrammatic cross-sectional side views (FIGS. 10A and 10B) of the region of the example integrated assembly of FIGS. 1 and 1A at an example process stage following the process stage of FIGS. 9, 9A and 9B. The cross-sectional views of FIGS. 10A and 10B are along the lines A-A and B-B of FIG. 10, respectively.
Figure 10A:
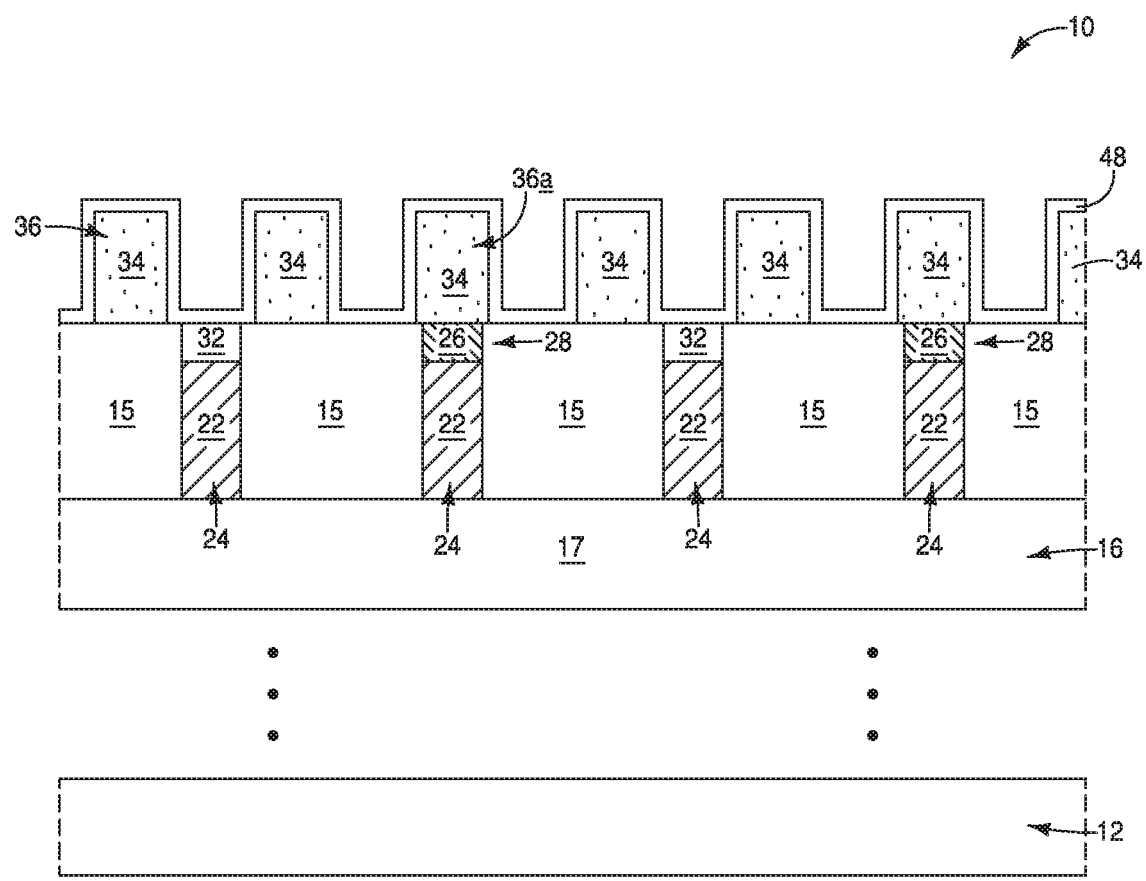
Figure 10B:
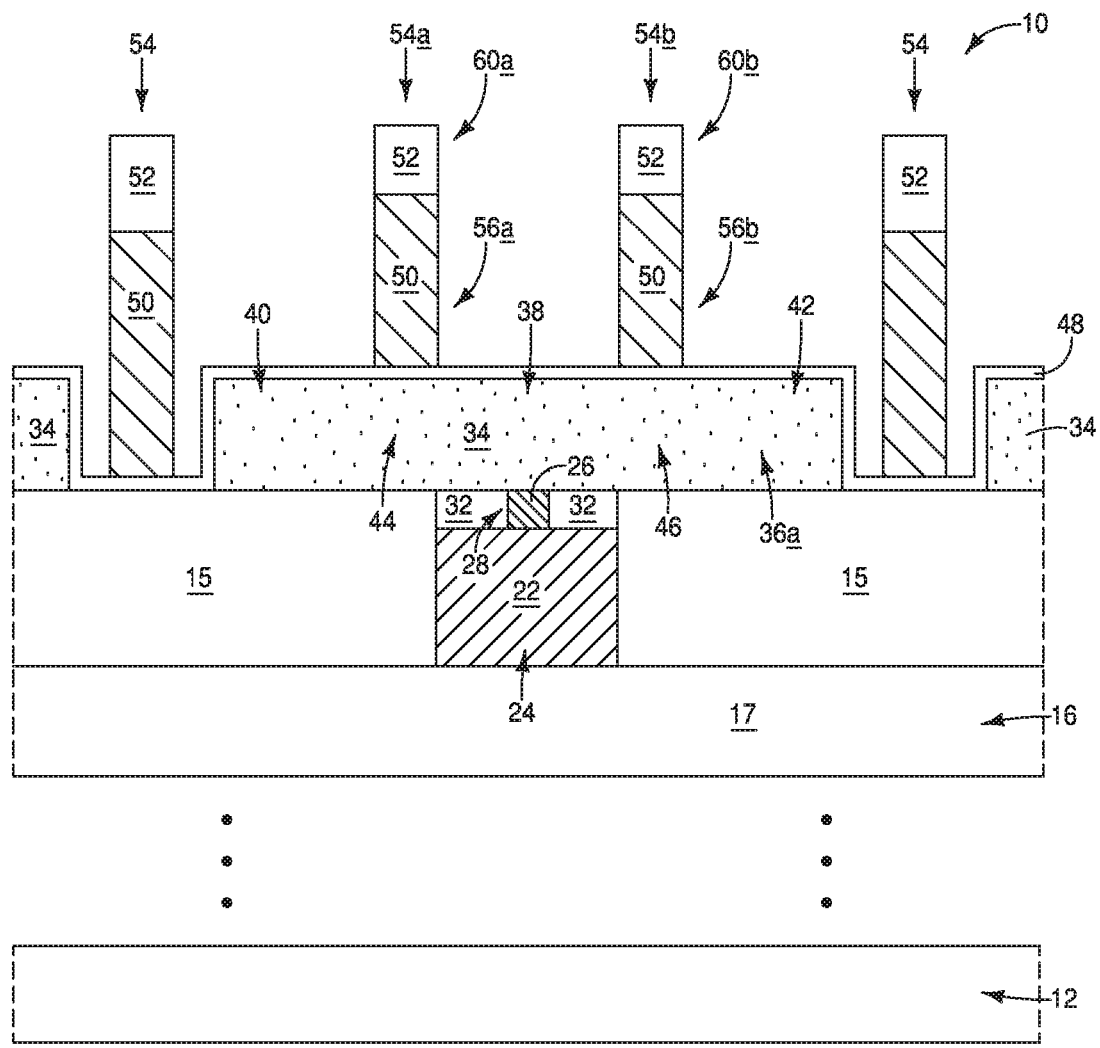

The active regions 36 are in one-to-one correspondence with the contacts 28. Each active region has a central region 38 over an associated one of the contacts 28, and has a pair of distal regions 40 and 42 which are horizontally offset from the central region. The regions 38, 40 and 42 are only labeled relative to the active region 36a, but are present relative to all of the active regions 36. In some embodiments, the regions 38, 40 and 42 may correspond to source/drain regions, and accordingly may be doped with suitable conductivity-enhancing dopant. The doping of the regions 38, 40 and 42 may be conducted at any suitable process stage; including, for example, one or more implants conducted after the patterning of the active regions 36, and/or after the patterning of the wordlines (FIGS. 10, 10A and 10B). Suitable dopants may include one or both of sulfur and selenium in applications in which the semiconductor material 34 comprises elements from Groups 13 and 15 of the periodic table; and may include one or both of nitrogen and fluorine in applications in which the semiconductor material 34 comprises elements from Groups 13 and 16 of the periodic table.

In some embodiments, the central source/drain region 38 may be referred to as an inner source/drain region, and the distal source/drain regions 40 and 42 may be referred to as outer source/drain regions. In some embodiments, the source/drain regions 40, 38 and 42 may be referred to as first, second and third source/drain regions, respectively.

The inner source/drain region 38 (or alternatively, the second source/drain region 38) is electrically coupled to the underlying digit line 24 through one of the conductive interconnects 28. In the shown embodiment, the conductive interconnect 28 directly contacts both the central source/drain region 38 and the digit line 24.

A region 44 is between the source/drain regions 38 and 40, and another region 46 is between the source/drain regions 38 and 42. The regions 44 and 46 may ultimately correspond to channel regions, and may be doped to an appropriate level with an appropriate dopant to achieve a desired threshold voltage. The doping, if any, of the regions 44 and 46 may be conducted at any suitable process stage. The regions 44 and 46 may be referred to as first and second channel regions, respectively.

Figure 9:
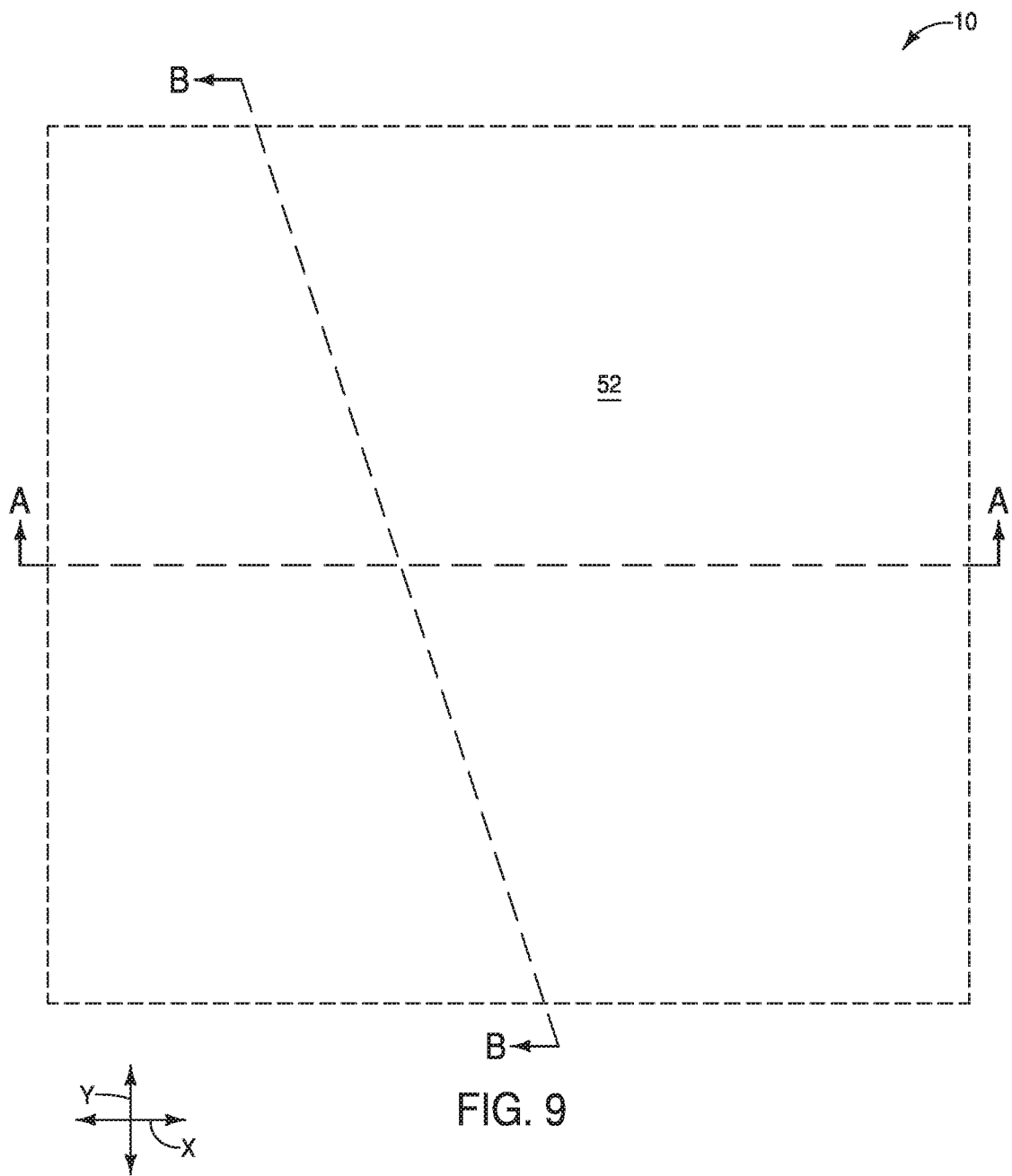
FIGS. 9, 9A and 9B are a diagrammatic top-down view (FIG. 9) and diagrammatic cross-sectional side views (FIGS. 9A and 9B) of the region of the example integrated assembly of FIGS. 1 and 1A at an example process stage following the process stage of FIGS. 8, 8A and 8B. The cross-sectional views of FIGS. 9A and 9B are along the lines A-A and B-B of FIG. 9, respectively.
Figure 9A:
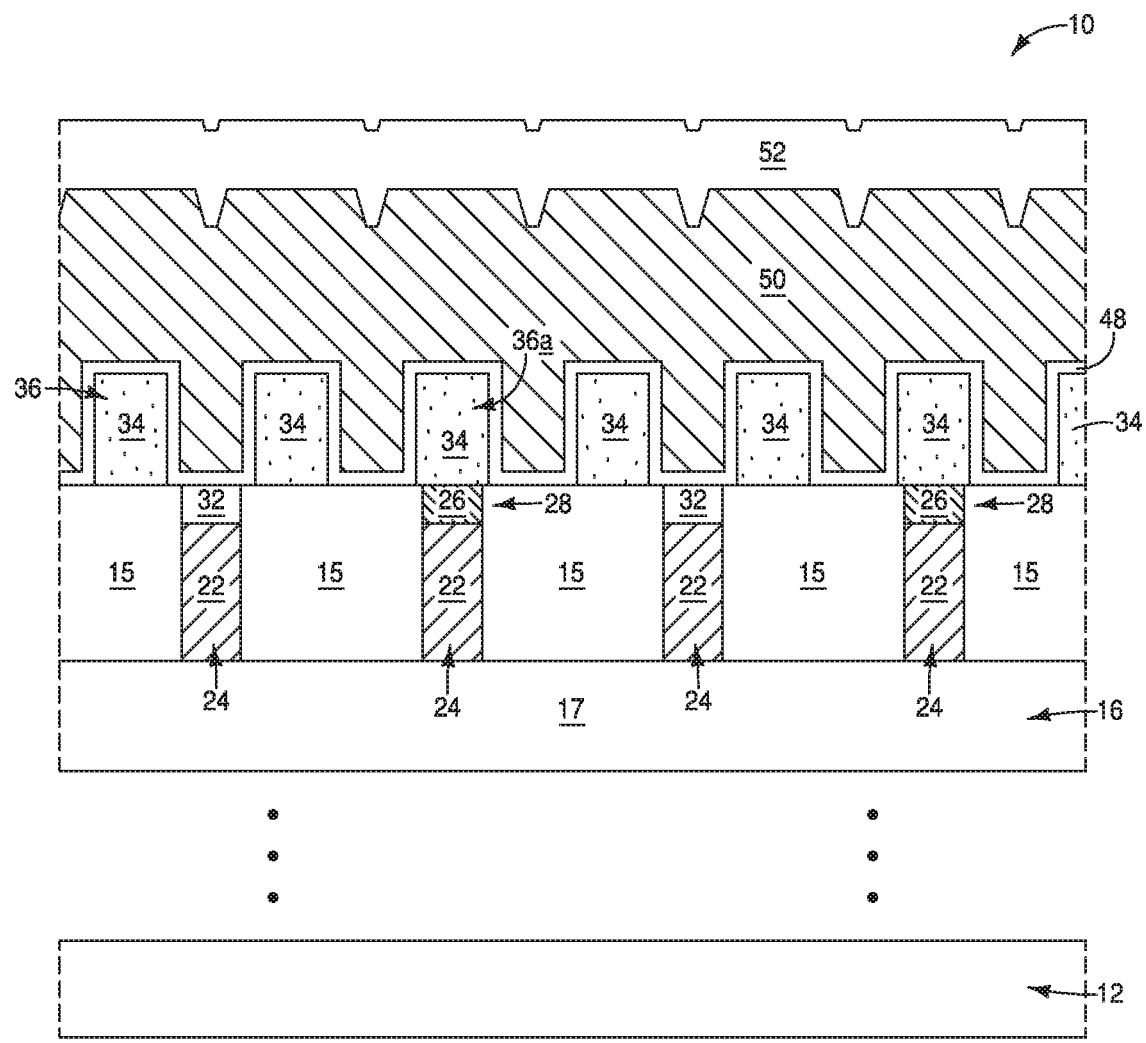
Figure 9B:
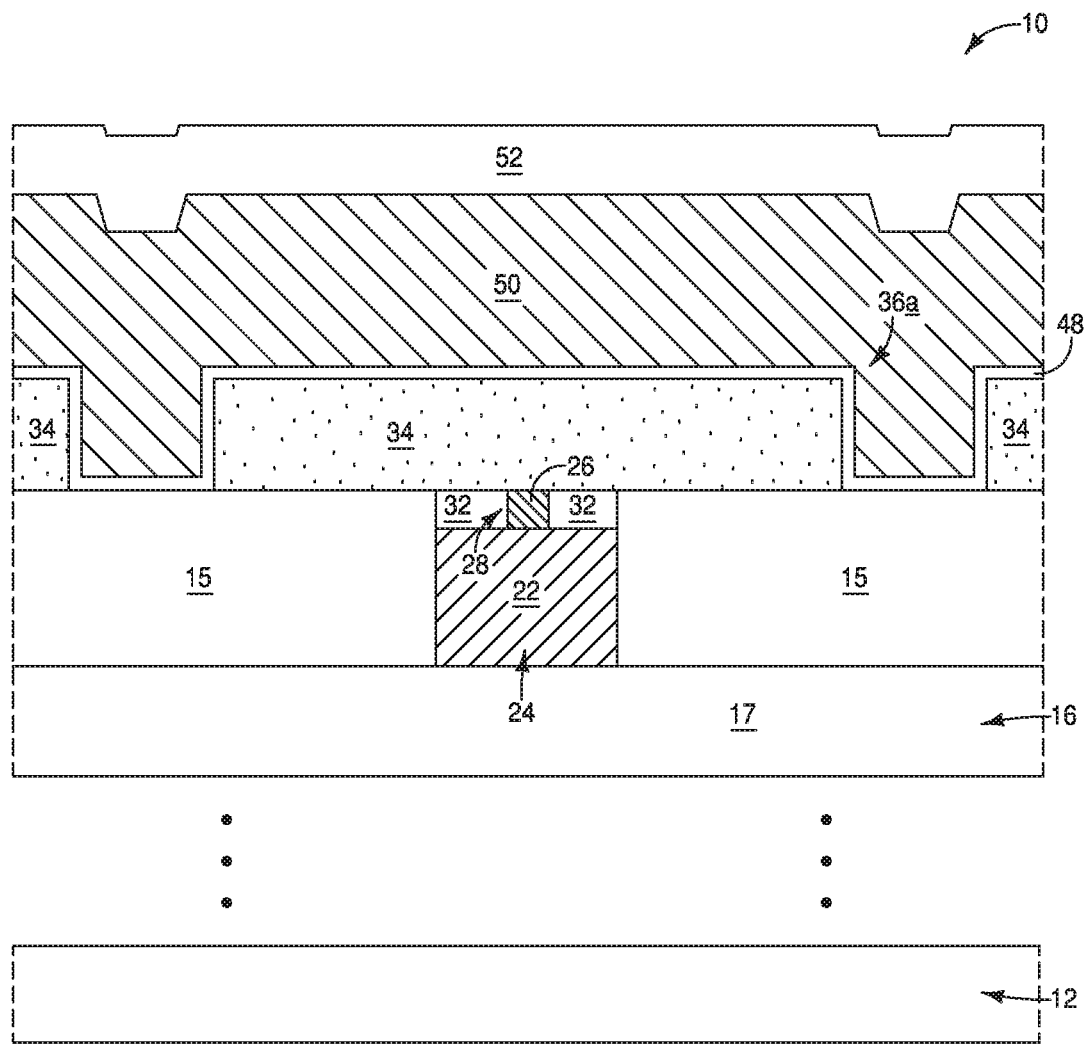

Referring to FIGS. 9, 9A and 9B, gate dielectric material (also referred to as dielectric material, or insulative material) 48 is formed over and between the active regions 36, conductive gate material 50 is formed over the gate dielectric material 48, and insulative capping material 52 is formed over the gate material 50.

The gate dielectric material 48 may comprise any suitable composition(s); and in some embodiment may comprise, consist essentially of, or consist of silicon dioxide.

The conductive gate material 50 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive gate material 50 may comprise one or more metal-containing materials; such as, for example, one or more of tungsten, titanium nitride, tantalum nitride, tungsten nitride, etc.

The insulative capping material 52 may comprise any suitable composition(s); and in some embodiments may comprise, consist essentially of, or consist of one or both of silicon dioxide and silicon nitride.

Referring to FIGS. 10, 10A and 10B, the conductive material 50 is patterned into wordlines 54. The wordlines extend along a second direction (the x-axis direction of FIG. 10). The second direction of the wordlines crosses the first direction of the digit lines (with such first direction being along the y-axis direction as shown in, for example, FIG. 3). In the illustrated embodiment of FIGS. 1-10, the second direction of the wordlines is substantially orthogonal to the first direction of the digit lines; with the term "substantially orthogonal" meaning orthogonal to within reasonable tolerances of fabrication and measurement. In other embodiments, the wordlines may cross the digit lines without extending substantially orthogonal to such digit lines.

The active regions 36 are shown in dashed-line (phantom) view relative to the top view of FIG. 10 to indicate that such active regions are under other materials.

Two of the wordlines 54 are labeled as 54a and 54b so that such wordlines may be distinguished from the other wordlines. The wordlines 54a and 54b are along the channel regions 44 and 46 associated with the active region 36a as shown in FIG. 10B. Regions of the wordlines 54a and 54b proximate the active region 36a may be considered to comprise transistor gates 56a and 56b. Each of the wordlines 54 will comprise a transistor gate where it crosses an active region, and the transistor gates 56a and 56b are to be understood as being representative of such transistor gates.

A transistor 60a comprises the transistor gate 56a, the channel region 44, and the source/drain regions 38 and 40. The transistor gate 56a may be considered to be operatively adjacent to (operatively proximate to) the channel region 44 such that a sufficient voltage applied to the gate 56a will induce an electric field which enables current flow through the channel region 44 to electrically couple the source/drain regions 38 and 40 with one another. If the voltage to the gate is below a threshold level, the current will not flow through the channel region 44, and the source/drain regions 38 and 40 will not be electrically coupled with one another. The selective control of the coupling/decoupling of the source/drain regions 38 and 40 through the level of voltage applied to the gate 56a may be referred to as gated coupling of the source/drain regions. In other words, the source/drain regions 38 and 40 may be considered to be gatedly coupled to one another through the channel region 44 during operation of the transistor 60a. Similarly, the gate 56b may be considered to be operatively adjacent to the channel region 46 such that source/drain regions 38 and 42 of a second transistor 60b may be gatedly coupled to one another through operation of the gate 56b. The gates 56a and 56b may be considered to be representative of a large number of transistor gates formed across the active regions 36 and associated with the wordlines 54.

Referring to FIGS. 11, 11A, 11B and 11C, insulative material 62 is formed along sidewalls of the wordlines 54 and along edges of the active regions 36. The material 62 may comprise any suitable composition(s); and in some embodiments may comprise, consist essentially of, or consist of one or both of silicon dioxide and silicon nitride. In some embodiments, the insulative material 62 may be referred to as spacer material. The insulative material 62 may be formed with any suitable processing. For instance, the material 62 may be deposited as a layer across a surface of the assembly 10, and may then be anisotropically etched into the illustrated configuration.

Figure 11:
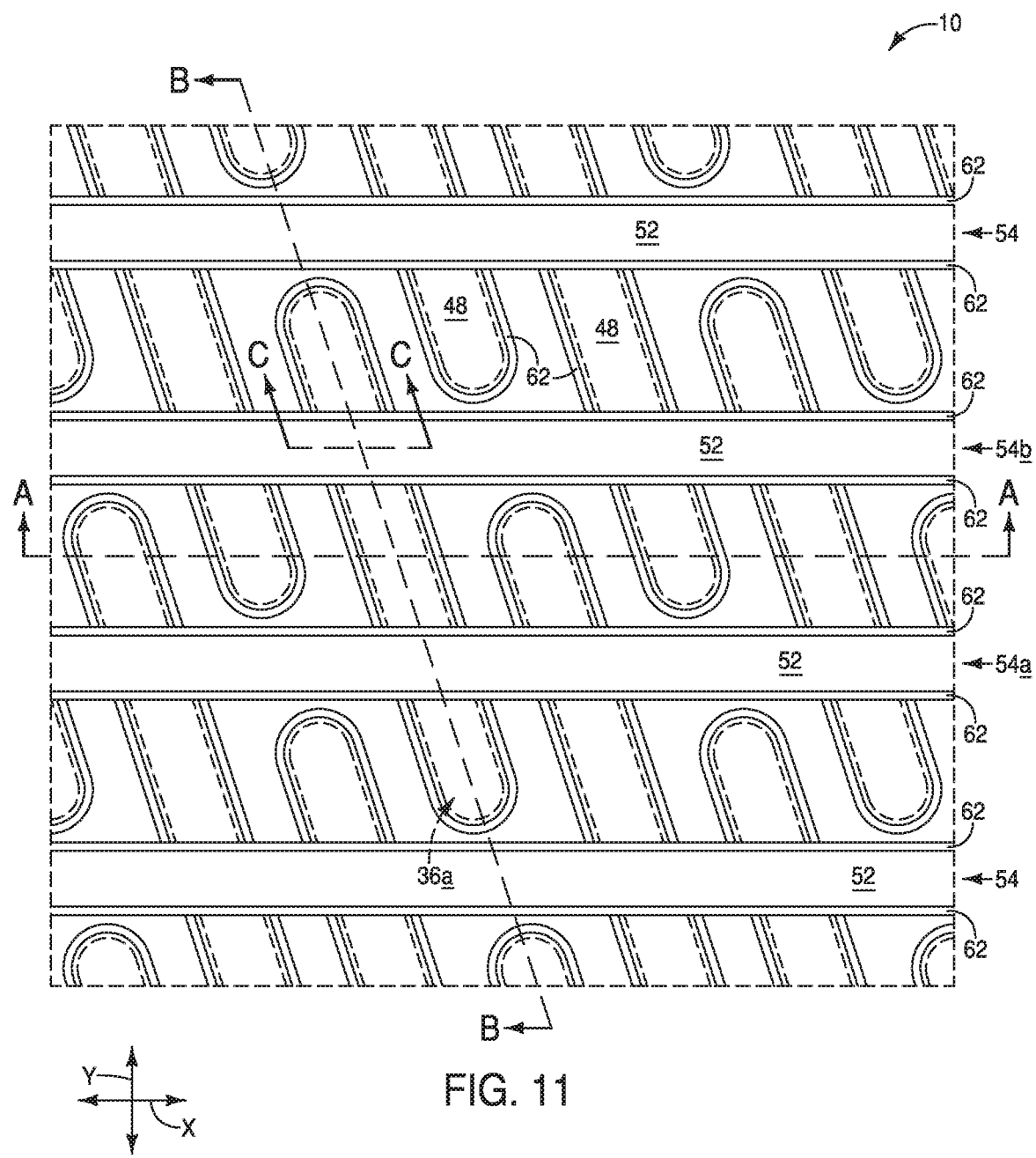
FIGS. 11, 11A, 11B and 11C are a diagrammatic top-down view (FIG. 11) and diagrammatic cross-sectional side views (FIGS. 11A, 11B and 11C) of the region of the example integrated assembly of FIGS. 1 and 1A at an example process stage following the process stage of FIGS. 10, 10A and 10B. The cross-sectional views of FIGS. 11A, 11B and 11C are along the lines A-A, B-B and C-C of FIG. 11, respectively.
Figure 11A:
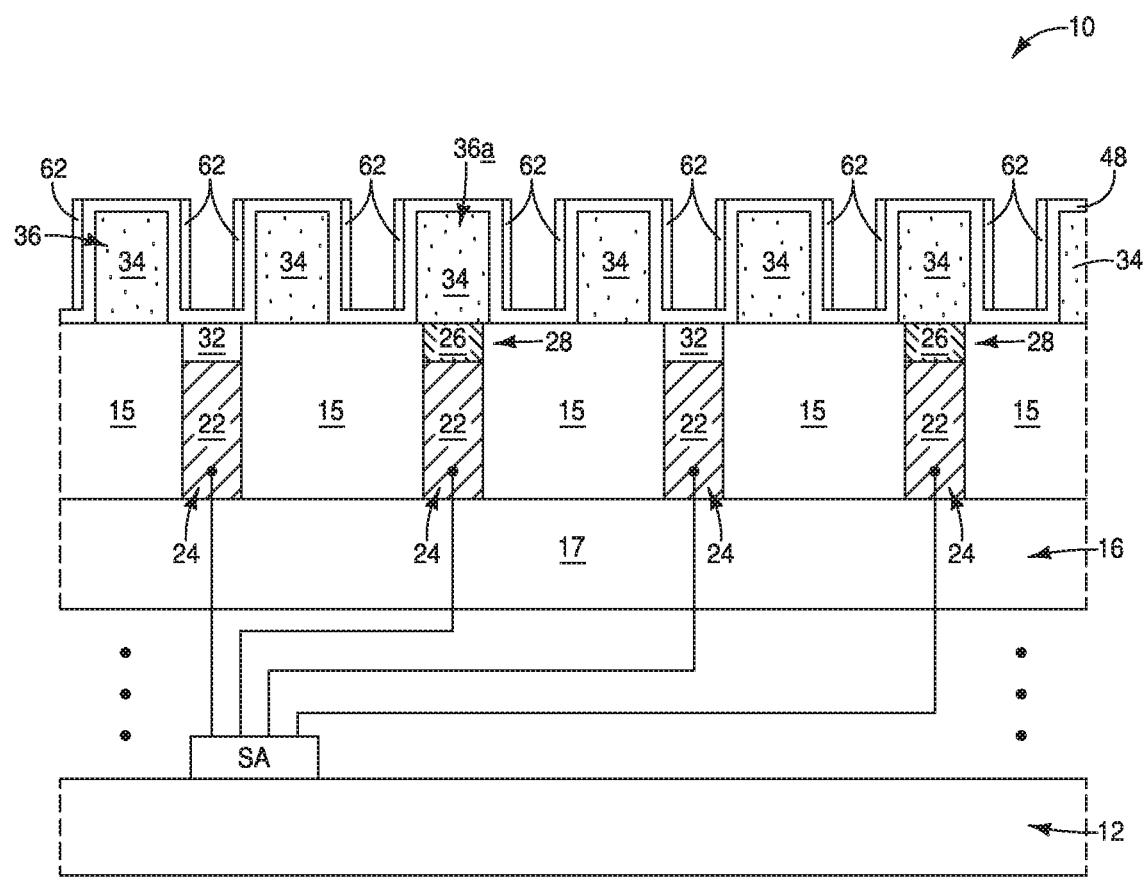

The cross-sectional view of FIG. 11A shows that the digit lines 24 may be electrically coupled with sense-amplifier-circuitry (SA), and that such sense-amplifier-circuitry may be supported by the base 12.

Figure 11B:
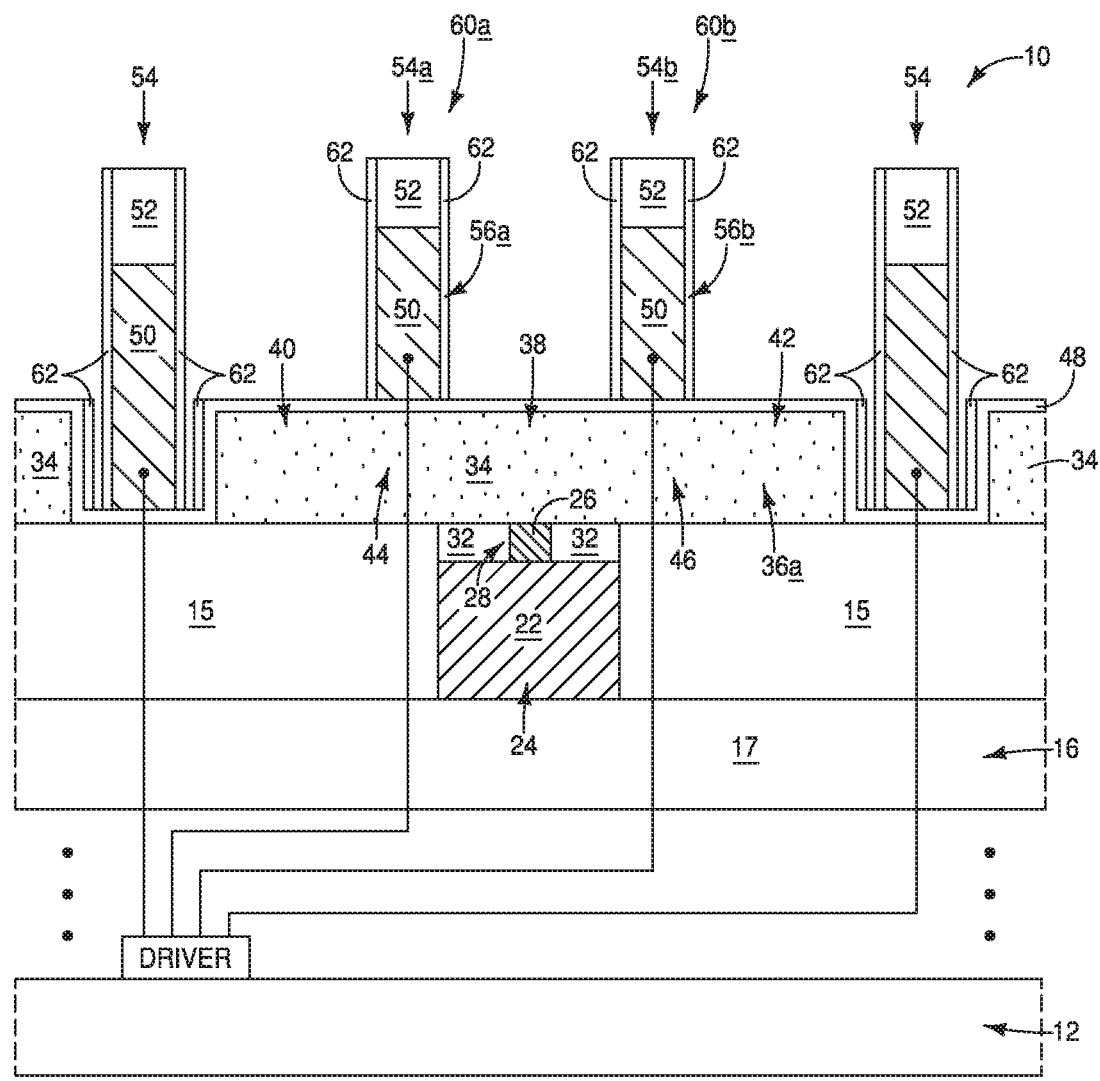

The cross-sectional view of FIG. 11B shows that the wordlines 54 may be electrically coupled with wordline-driver-circuitry (DRIVER), and that such wordline-driver-circuitry may be supported by the base 12.

The illustrated wordlines 54 and digit lines 24 may be representative of a large number of wordlines and digit lines formed across a memory array. For instance, the memory array may have hundreds, thousands, millions, etc., of substantially identical wordlines, and substantially identical digit lines. The wordlines may be considered to extend along rows of the memory array, and the digit lines may be considered to extend along columns of the memory array.

Figure 11C:
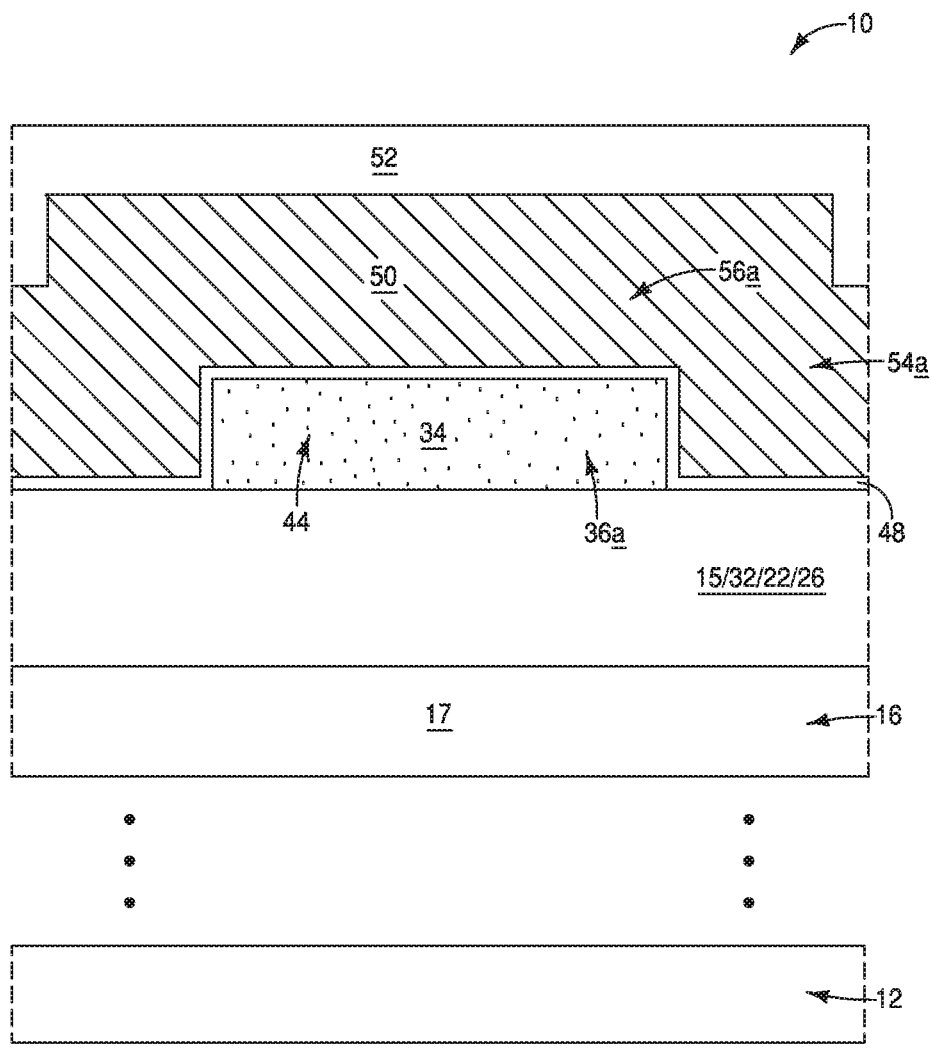

FIG. 11C shows a cross-section through the channel region 44 (with FIG. 11C being at a different scale than FIG. 11). The structure under the channel region is generically illustrated as 15/32/22/26 to indicate that such structure may comprise one or more of the materials 15, 32, 22 and 26. However, the specific materials 15, 32, 22 and 26 are not shown in FIG. 11C so that the emphasis of the drawing is on the channel region 44 and the wordline 54a extending along such channel region. In the illustrated embodiment, the wordline 54a comprises a gate 56a, and such gate extends along a top of the channel region 44 and along sidewalls of the channel region 44. However, the gate only extends partially around the channel region, and does not extend entirely around the channel region (specifically, does not extend along a bottom of the channel region). In other embodiments (described below with reference to FIG. 13) the gate may extend entirely around the channel region.

Figure 12:
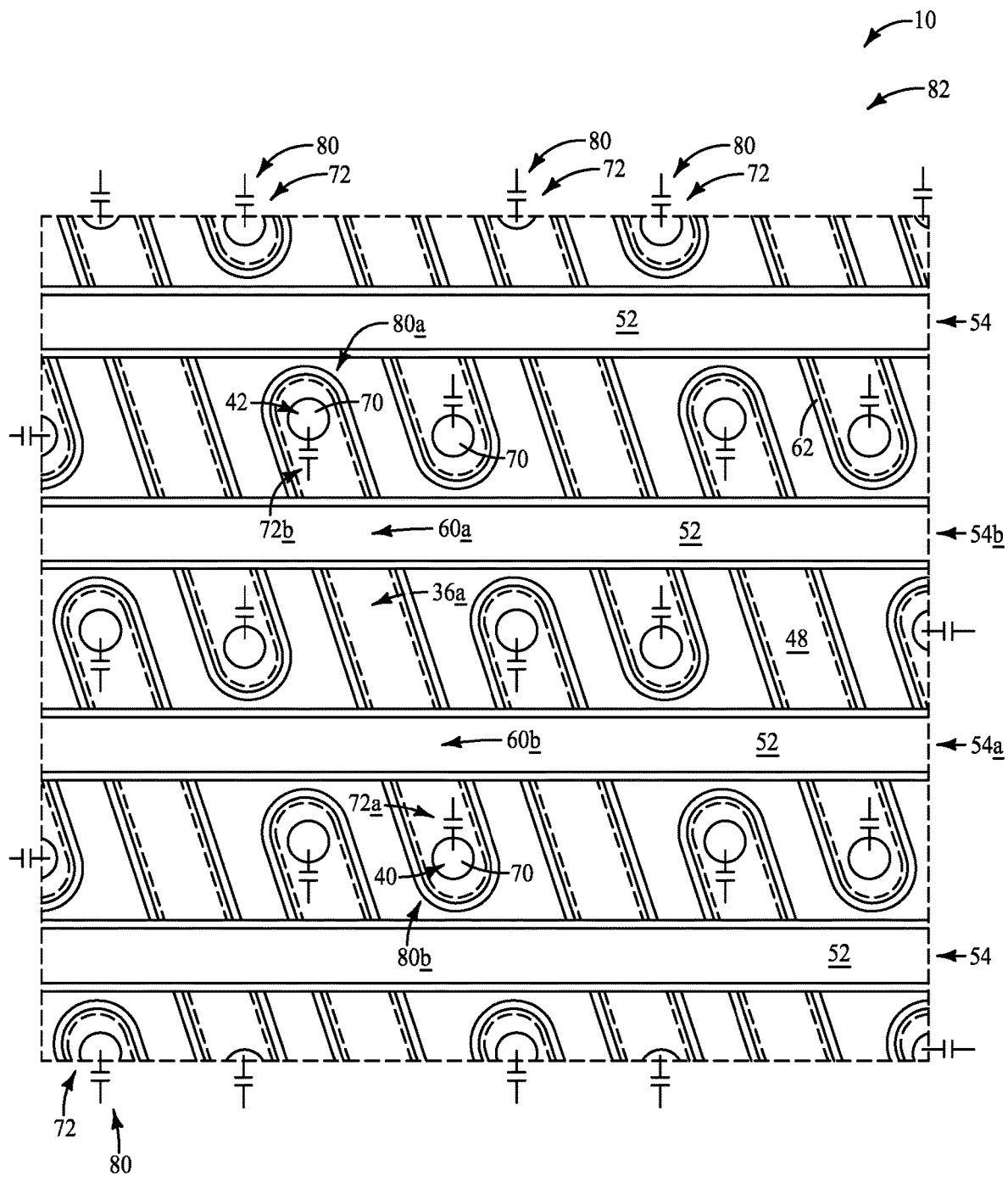
FIG. 12 is a diagrammatic top-down view of the region of the example integrated assembly of FIG. 11 incorporated into an example memory array.

Referring to FIG. 12, the integrated assembly 10 is illustrated at a process stage which may follow the process stage of FIG. 11. Specifically, contacts 70 (only some of which are labeled) are formed to extend to the distal (outer) source/drain regions associated with the active regions 36 (e.g., the source/drain regions 40 and 42 associated with the active region 36a), and then storage-elements 72 (only some of which are labeled) are formed over the active regions and electrically coupled with the distal source/drain regions through the contacts 70. The storage-elements may be any suitable devices having at least two detectable states; and in some embodiments may be, for example, capacitors (as shown), resistive-memory devices, conductive-bridging devices, phase-change-memory (PCM) devices, programmable metallization cells (PMCs), etc. In some embodiments, one or more of the contacts 70 could be spatially shifted with a redistribution layer in order to closely pack the storage elements.

In some embodiments, each of the active regions 36 may be considered to be associated with two of the storage-elements 72, with one of the storage-elements being a first storage-element and the other being a second storage-element. For instance, the active region 36a is shown to be associated with two storage-elements 72a and 72b. The storage-element 72a may be considered to be a first storage-element which is electrically coupled with the first source/drain region 40. The storage-element 72b may be considered to be a second storage-element which is electrically coupled with the second source/drain region 42.

Memory cells 80 (only some of which are labeled) may comprise the storage-elements 72. In some embodiments, the transistors (e.g., 60a and 60b) may be considered to be access transistors of the memory cells 80. For instance, the transistor 60a may be considered to be an access device for a memory cell labeled 80a, and the transistor 60b may be considered to be an access device for the memory cell labeled 80b.

A memory array 82 comprises the memory cells 80. The illustrated memory cells may be representative of a large number of substantially identical memory cells formed across the memory array. Each of the memory cells may be uniquely addressed by one of the wordlines 54 and one of the digit lines 24.

Figure 13:
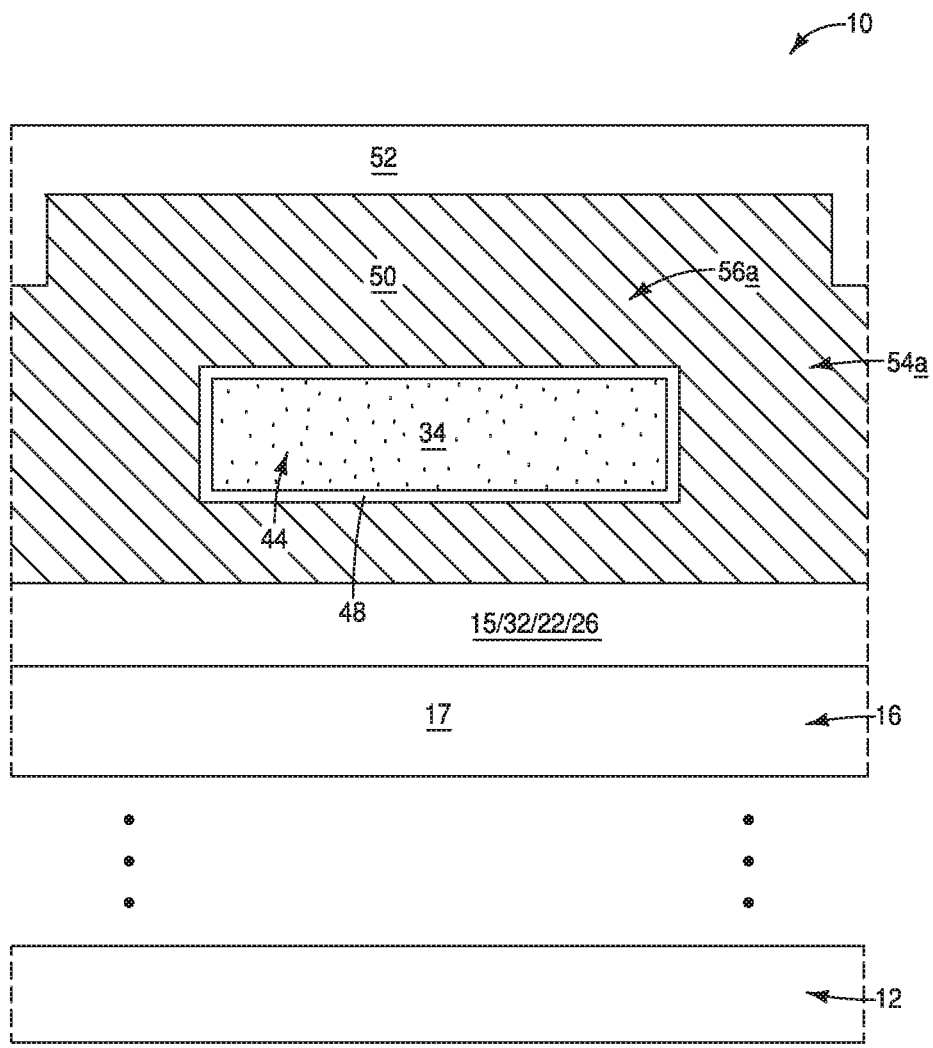
FIG. 13 is a diagrammatic cross-sectional side view of a region of an example integrated assembly alternative to the region shown in FIG. 11C.

The configurations of the structures described above with reference to FIGS. 11 and 12 are example configurations, and other suitable configurations may be utilized in other embodiments. For instance, FIG. 13 shows a view of a channel region 44 analogous to that described above with reference to FIG. 11C. However, the embodiment of FIG. 13 has the transistor gate 56a entirely surrounding an outer periphery of the channel region 44.

Figure 14:
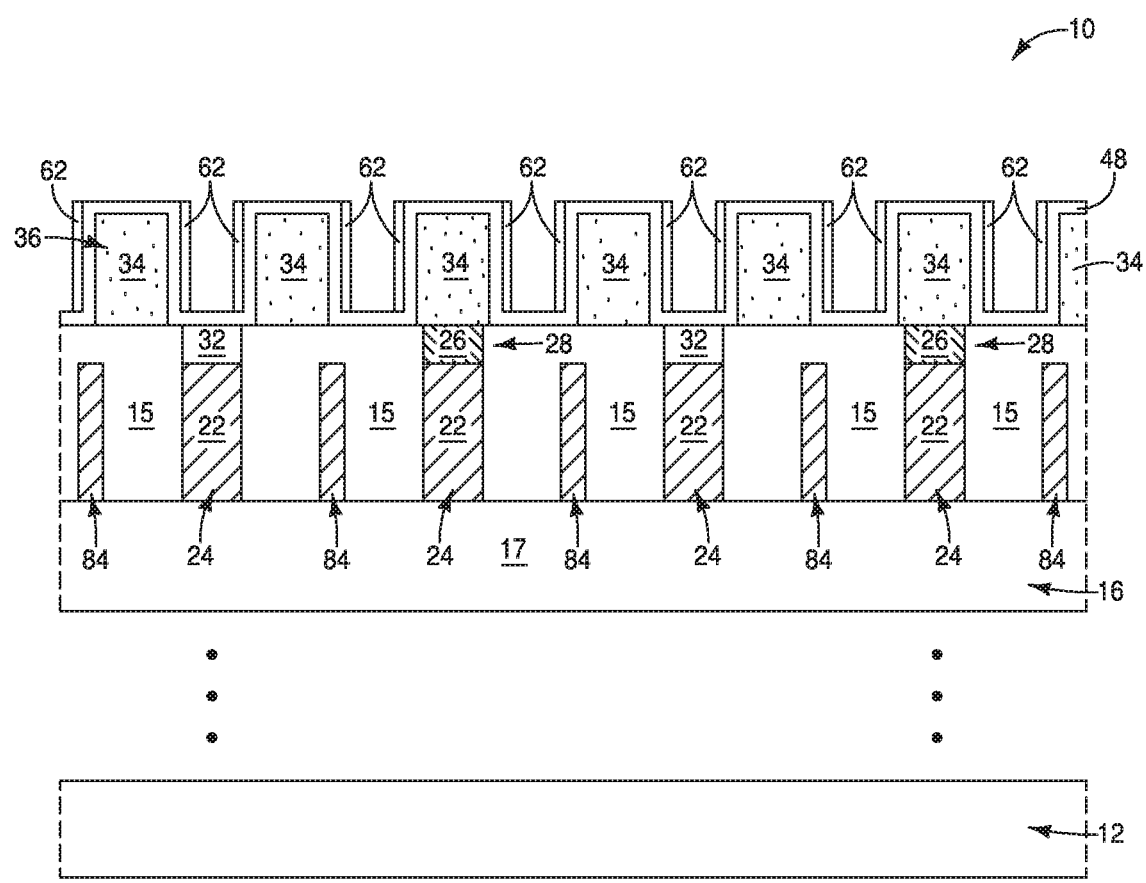
FIG. 14 is a diagrammatic cross-sectional side view of a region of an example integrated assembly alternative to the region shown in FIG. 11A.

As another example, FIG. 14 shows digit lines 24 in an arrangement similar to that of FIG. 11A, but shows shield lines 84 between the digit lines. The shield lines 84 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The shield lines 84 may be electrically coupled with a reference voltage (e.g., ground, VCC/2), may be electrically floating, or may be electrically coupled with an active circuit. The shield lines may assist in precluding capacitive coupling (crosstalk) between adjacent digit lines during operation of a memory array.

The formation of the digit lines 24 beneath the active areas 36 in the embodiments described above (e.g., the embodiments of FIGS. 11 and 12) may enable additional room to be provided for the digit lines as compared to conventional structures. Such may enable larger digit lines to be utilized, which may reduce resistance along the digit lines.

The utilization of semiconductor material comprising elements from groups 13 and 15 of the periodic may enable low leakage (e.g., negligible gate induced drain leakage (GIDL)) which may improve device refresh as compared to conventional configurations.

The configurations described above (e.g., the memory array configurations of FIGS. 11 and 12) may enable low coupling (crosstalk) between adjacent wordlines, which may alleviate a so-called "row hammer" problem associated with conventional architectures.

Figure 15:
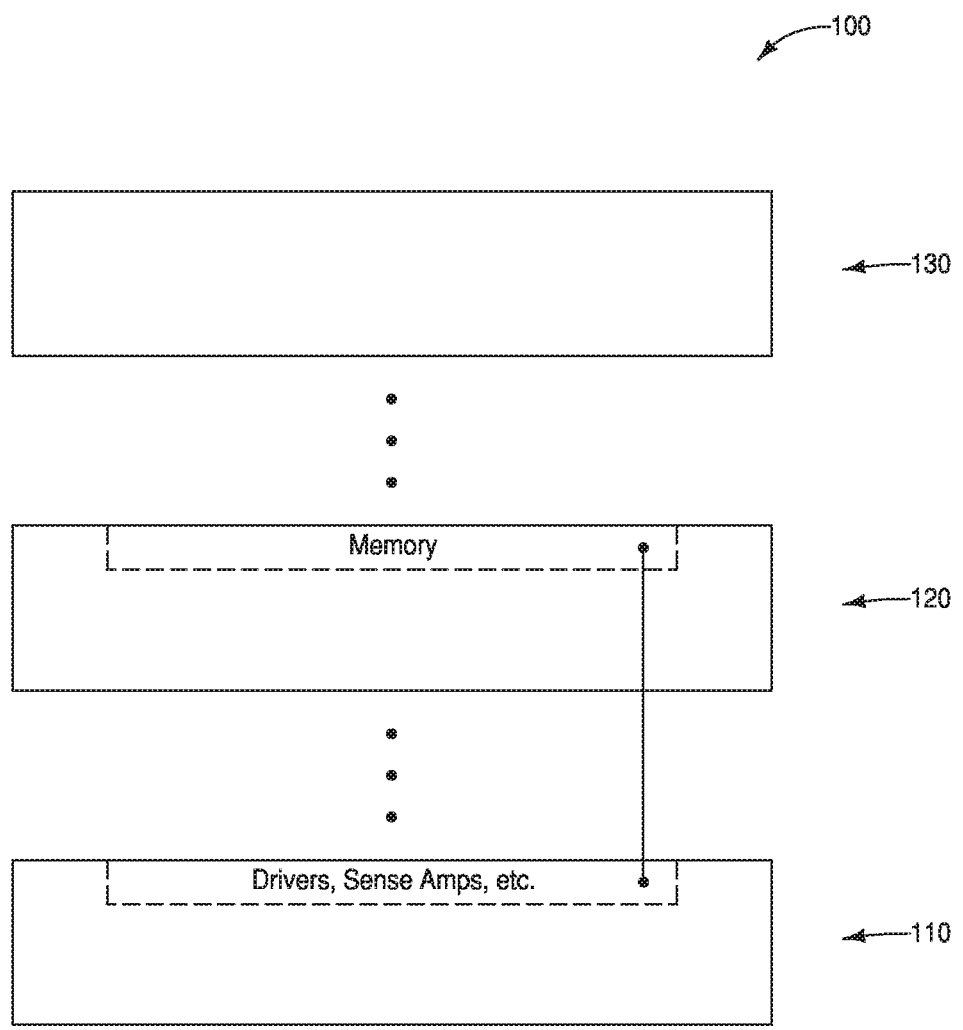
FIG. 15 is a diagrammatic cross-sectional side view of an assembly comprising a vertical stack of tiers.

In some embodiments, the memory arrays described herein (e.g., the memory array 82 of FIG. 12) may be within a memory tier (i.e., memory deck) which is within a vertically-stacked arrangement of tiers (or decks). For instance, FIG. 15 shows a portion of an integrated assembly 100 comprising a vertically-stacked arrangement of tiers 110, 120 and 130. The vertically-stacked arrangement may extend upwardly to include additional tiers. The tiers 110, 120 and 130 may be considered to be examples of levels that are stacked one atop the other. The levels may be within different semiconductor dies, or at least two of the levels may be within the same semiconductor die.

The bottom tier (first tier) 110 may include control circuitry and/or sensing circuitry (e.g., may include word-line-driver-circuitry, sense-amplifier-circuitry, etc.); and in some applications may comprise CMOS circuitry. The upper tiers (second and third tiers) 120 and 130 may include memory arrays, such as, for example, the memory array 82 described above with reference to FIG. 12. The memory arrays within the various tiers may be the same as one another (e.g., may all be DRAM arrays), or may be different relative to one another (e.g., some may be DRAM arrays, while others are NAND arrays). Also, one or more of the upper tiers may include control circuitry or other logic circuitry.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a digit line which includes a first conductive material, and which extends substantially horizontally. An interconnect extends upwardly from the digit line and includes a second conductive material. An active region is over the interconnect and extends substantially horizontally. The active region includes semiconductor material. The active region includes first and second source/drain regions within the semiconductor material, and includes a channel region within the semiconductor material and between the first and second source/drain regions. The interconnect electrically couples the second source/drain region with the digit line. A transistor gate is operatively proximate the channel region. A storage-element is electrically coupled with the first source/drain region.

Some embodiments include an integrated assembly having an active region which contains semiconductor material. The active region includes first, second and third source/drain regions within the semiconductor material, includes a first channel region within the semiconductor material and between the first and second source/drain regions, and includes a second channel region within the semiconductor material and between the second and third source/drain regions. The semiconductor material includes at least one element selected from Group 13 of the periodic table. A digit line is electrically coupled with the second source/drain region. A first transistor gate is operatively proximate the first channel region. A second transistor gate is operatively proximate the second channel region. A first storage-element is electrically coupled with the first source/drain region. A second storage-element is electrically coupled with the third source/drain region.

Some embodiments include a method of forming an integrated assembly. Spaced-apart digit lines are formed to extend along a first direction. Conductive interconnect material is formed over the digit lines. The conductive interconnect material is patterned into spaced-apart contacts which are electrically coupled with the digit lines. Semiconductor material is formed over the spaced-apart contacts. The semiconductor material is patterned into active regions. The active regions are in one-to-one correspondence with the contacts. Each active region has a central region over an associated one of the contacts, and has a pair of distal regions horizontally offset from the central region. Outer source/drain regions are formed within the distal regions of the active regions. Inner source/drain regions are formed within the central regions of the active regions. Channel regions are between the inner and outer source/drain regions. The inner source/drain regions are electrically coupled to the digit lines through the contacts. Wordlines are formed to extend along a second direction. The second direction crosses the first direction. The wordlines comprise transistor gates along the channel regions. Storage-elements are formed to be electrically coupled with the outer source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a digit line comprising a first conductive material and extending substantially horizontally;
    an interconnect extending upwardly from the digit line and comprising a second conductive material;
    an active region over the interconnect and extending substantially horizontally; the active region comprising semiconductor material, including first and second source/drain regions within the semiconductor material, and including a channel region within the semiconductor material and between the first and second source/drain regions; the interconnect electrically coupling the second source/drain region with the digit line;
    a transistor gate operatively proximate the channel region, an entirety of the transistor gate being disposed elevationally above the interconnect; and
    a storage-element electrically coupled with the first source/drain region.

2. The integrated assembly of claim 1 wherein the semiconductor material comprises a metal selected from the group consisting of aluminum, gallium, indium, thallium, tin, cadmium, zinc and mixtures thereof, in combination with one or more of oxygen, sulfur, selenium and tellurium.

3. The integrated assembly of claim 1 wherein the digit line is supported by a base having a planar, horizontal upper surface; and wherein the substantially horizontally extending digit line extends along a direction which is within 10° of parallel to the horizontal upper surface.

4. The integrated assembly of claim 1 wherein the semiconductor material comprises at least one element from Group 13 of the periodic table in combination with at least one element from Group 15 of the periodic table.

5. The integrated assembly of claim 4 wherein the semiconductor material comprises one or more of GaP, AIAs, GaAs, AIP, InP, AlSb, GaAlAs, GaInAs and GaInP; where the chemical formulas indicate primary constituents rather than specific stoichiometries.

6. The integrated assembly of claim 1 wherein the semiconductor material comprises at least one element from Group 13 of the periodic table in combination with at least one element from Group 16 of the periodic table.

7. The integrated assembly of claim 6 wherein the semiconductor material comprises:
    at least one element selected from the group consisting of gallium, indium and mixtures thereof; and
    at least one element selected from the group consisting of oxygen, sulfur, selenium, tellurium and mixtures thereof.

8. The integrated assembly of claim 1 wherein the second conductive material is compositionally different from the first conductive material.

9. The integrated assembly of claim 8 wherein the first and second conductive materials are metal-containing materials.

10. The integrated assembly of claim 8 wherein the first conductive material comprises tungsten, and wherein the second conductive material comprises a metal nitride directly against the tungsten.

11. The integrated assembly of claim 1 wherein:
    the channel region is a first channel region, the transistor gate is a first transistor gate, and the storage-element is a first storage-element;
    the active region includes a second channel region on an opposing side of the second source/drain region from the first channel region, and includes a third source/drain region on an opposing side of the second channel region from the second source/drain region:
wherein a second transistor gate is operatively proximate the second channel region; and
wherein a second storage-element is electrically coupled with the third source/drain region.

12. The integrated assembly of claim 11 wherein the first and second storage-elements include one or more of capacitors, resistive-memory devices, conductive-bridging devices, phase-change-memory devices and programmable metallization cells.

13. The integrated assembly of claim 11 wherein the first and second storage-elements are capacitors.

14. An integrated assembly, comprising:
an active region comprising semiconductor material; the active region including first, second and third source/drain regions within the semiconductor material, including a first channel region within the semiconductor material and between the first and second source/drain regions, and including a second channel region within the semiconductor material and between the second and third source/drain regions; the semiconductor material including at least one element selected from Group 13 of the periodic table;
a digit line disposed beneath a bottom surface of the active region and electrically coupled with the second source/drain region;
a first transistor gate elevationally above the bottom surface of the active region and operatively proximate the first channel region;
a second transistor gate elevationally above the bottom surface of the active region and operatively proximate the second channel region;
a first storage-element electrically coupled with the first source/drain region; and
a second storage-element electrically coupled with the third source/drain region.

15. The integrated assembly of claim 14 wherein the first and second transistor gates entirely surround outer peripheries of the first and second channel regions.

16. The integrated assembly of claim 14 wherein the first and second transistor gates do not entirely surround outer peripheries of the first and second channel regions.

17. The integrated assembly of claim 14 wherein the semiconductor material further includes at least one element selected from Group 15 of the periodic table.

18. The integrated assembly of claim 17 wherein the semiconductor material comprises one or more of GaP, AlAs, GaAs, AlP, InP, AlSb, GaAlAs, GaInAs and GaInP; where the chemical formulas indicate primary constituents rather than specific stoichiometries.

19. The integrated assembly of claim 14 wherein the semiconductor material further includes at least one element selected from Group 16 of the periodic table.

20. The integrated assembly of claim 19 wherein the semiconductor material comprises:
at least one element selected from the group consisting of gallium, indium and mixtures thereof; and
at least one element selected from the group consisting of oxygen, sulfur, selenium, tellurium and mixtures thereof.

21. The integrated assembly of claim 14 wherein:
the digit line is under the second source/drain region;
the digit line is electrically coupled with sense-amplifier-circuitry;
the first and second transistor gates are electrically coupled with first and second wordlines, respectively;
the wordlines are electrically coupled with wordline-driver-circuitry; and
the first and second storage-elements are within first and second memory cells of a memory array.

22. The integrated assembly of claim 21 wherein:
the first and second wordlines are two of many substantially identical wordlines;
the digit line is one of many substantially identical digit lines;
the first and second memory cells are two of many substantially identical memory cells, with each of the memory cells being uniquely addressed through one of the digit lines in combination with one of the wordlines; and
conductive shield lines are between the digit lines.

23. The integrated assembly of claim 21 wherein the first and second storage-elements are capacitors.

24. The integrated assembly of claim 21 wherein:
the sense-amplifier-circuitry and the wordline-driver-circuitry are within a first tier of a vertically-stacked arrangement of tiers;
the memory array is within a second tier of the vertically-stacked arrangement of tiers; and
the second tier is over the first tier.

* * * * *